(12) United States Patent
Haratipour et al.

(10) Patent No.: US 12,048,165 B2
(45) Date of Patent: Jul. 23, 2024

(54) FERROELECTRIC CAPACITORS AND METHODS OF FABRICATION

(71) Applicant: Intel Corporation, Santa Clara, CA (US)

(72) Inventors: Nazila Haratipour, Portland, OR (US); Sou-Chi Chang, Portland, OR (US); Shriram Shivaraman, Hillsboro, OR (US); I-Cheng Tung, Hillsboro, OR (US); Tobias Brown-Heft, Portland, OR (US); Devin R. Merrill, McMinnville, OR (US); Che-Yun Lin, Beaverton, OR (US); Seung Hoon Sung, Portland, OR (US); Jack Kavalieros, Portland, OR (US); Uygar Avci, Portland, OR (US); Matthew V. Metz, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 771 days.

(21) Appl. No.: 16/914,140

(22) Filed: Jun. 26, 2020

(65) Prior Publication Data
US 2021/0408018 A1 Dec. 30, 2021

(51) Int. Cl.
| H10B 53/00 | (2023.01) |
| G11C 11/22 | (2006.01) |
| H01G 4/008 | (2006.01) |
| H01L 27/08 | (2006.01) |
| H01L 49/02 | (2006.01) |
| H10B 53/10 | (2023.01) |

(52) U.S. Cl.
CPC ............ *H10B 53/00* (2023.02); *G11C 11/221* (2013.01); *H01G 4/008* (2013.01); *H01L 27/0805* (2013.01); *H01L 28/65* (2013.01); *H10B 53/10* (2023.02)

(58) Field of Classification Search
CPC ........ H10B 53/00; H10B 53/10; H10B 53/20; H10B 53/30; G11C 11/221; H01G 4/008; H01L 27/0805; H01L 28/65
See application file for complete search history.

(56) References Cited

U.S. PATENT DOCUMENTS

| 2019/0006376 A1* | 1/2019 | Ramaswamy | H10B 12/03 |
| 2019/0066751 A1* | 2/2019 | Matsubara | H10B 53/20 |
| 2021/0125993 A1* | 4/2021 | An | H10B 12/34 |
| 2022/0208778 A1* | 6/2022 | Haratipour | H10B 53/10 |
| 2023/0225134 A1* | 7/2023 | Tsukamoto | H10B 53/10 257/295 |

FOREIGN PATENT DOCUMENTS

| CN | 109075176 A | * 12/2018 | ........... G11C 11/223 |
| KR | 20150091609 A | * 8/2015 | ............. H10B 53/30 |

* cited by examiner

*Primary Examiner* — Matthew E Warren
(74) *Attorney, Agent, or Firm* — Essential Patents Group, LLP

(57) ABSTRACT

An integrated circuit capacitor structure, includes a first electrode includes a cylindrical column, a ferroelectric layer around an exterior sidewall of the cylindrical column and a plurality of outer electrodes. The plurality of outer electrodes include a first outer electrode laterally adjacent to a first portion of an exterior of the ferroelectric layer and a second outer electrode laterally adjacent to a second portion of the exterior of the ferroelectric layer, wherein the second outer electrode is above the first outer electrode.

16 Claims, 20 Drawing Sheets

FERROELECTRIC CAPACITORS AND METHODS OF FABRICATION

BACKGROUND

Ferroelectric materials have a wide variety of applications in the modern electronic industry. These materials have been widely studied for non-volatile memory, neuromorphic applications and steep slope devices. Non-volatility, fast switching speed, scalability and reliability make these materials interesting for memory applications. Transistor scalability is one of the main key elements of increasing memory density and capacity, however scaling state-of-the-art transistors for sub 10 nm nodes presents challenges. Architectural innovation and novel materials can pave the path for moving toward future technologies.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

DESCRIPTION OF THE EMBODIMENTS

Figure 1A:
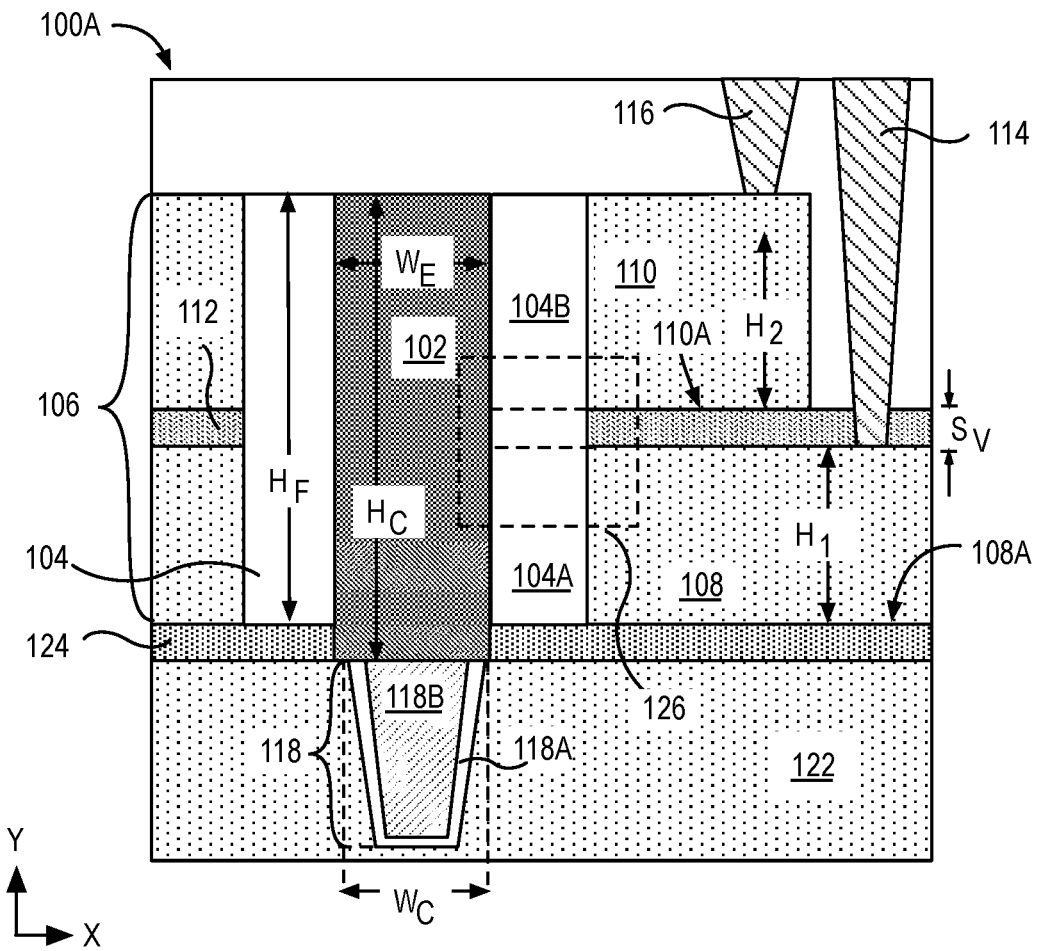
FIG. 1A illustrates a cross-sectional view of an integrated circuit capacitor structure including a ferroelectric layer, in accordance with an embodiment of the present disclosure.

Various integrated circuit capacitor devices with ferroelectric (or antiferroelectric) materials are described. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as transistor operations and switching operations associated with capacitors, are described in lesser detail in order to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, electrical or in magnetic contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/ material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

As used throughout this description, and in the claims, a list of items joined by the term "at least one of" or "one or more of" can mean any combination of the listed terms. Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

In semiconductor devices such as DRAMs (Dynamic Random-Access Memory), each memory cell includes one transistor and one capacitor. In DRAMs, cells require periodic reading and refreshing. Owing to the advantages of low price-per-unit-bit, high integration, and ability to simultaneously perform read and write operations, DRAMs have enjoyed widespread use in commercial applications. Dynamic random-access memory (DRAM) utilizes charge storage in capacitors as programmable bits of memory. However, with scaling feature sizes of transistors, a space available for a capacitor above each transistor may be reduced. Variability and increased leakage can also limit the possibility of further scaling access transistors. A capacitor having a cylindrical geometry can facilitate scaling, because a footprint of the cylindrical capacitor may be smaller than a footprint of a transistor controlling the capacitor. However, to create a large array of programmable bits with a 1T-1C architecture requires a large number of singly dedicated transistors. Furthermore, since, conventional cylindrical or trench capacitor based on high-K dielectric materials is a charge-based storage device, retaining memory in a bit depends on insulating the charge from leaking to nearby interconnects and devices. Leakage path to nearby interconnects and devices is shortened with scaling.

Ferroelectric materials may bridge the gap for capacitor-based memory devices, where the ferroelectric materials can be used as a replacement for conventional high-K dielectric materials. Not only do ferroelectric materials have a higher dielectric constant (greater than 30) compared to high-K materials such as oxides of Hf, Zr etc, but ferroelectric materials are often split into domains having different directions of spontaneous polarization. Spontaneous polarization results from atomic separation between the constituent atoms in a ferroelectric material that create electric dipoles within the ferroelectric material. A single domain includes a large collection of dipoles having a single orientation.

Dipoles in a ferroelectric material can have their orientation altered by an externally applied electric field. When a ferroelectric material is sandwiched between two electrodes, for example as in a capacitor, applying a potential difference between the two electrodes can generate an electric field. If the electric field is sufficiently large, the direction of the spontaneous polarization can be set by the applied electric field. The applied electric field (due to the potential difference) can manipulate the direction of the polarization in the ferroelectric material. The direction of the polarization may be set in the ferroelectric material at a beginning of operation and reset at any time.

Because polarization in one or more domains in a ferroelectric material can respond to locally applied external fields, the polarization can be set (or programmed) independently over a region of the ferroelectric material covered by the one or more domains. In different material embodiments, a single domain can range between 10 nm to 50 nm. The domain sizes may also depend on a thickness of the ferroelectric material, which can vary between different materials. The number of domains, over which a polarization is to be set may depend on a spatial extent of the smallest electrode sandwiching the ferroelectric material. The direction of polarization set in the ferroelectric material corresponds to a single memory storage bit.

In accordance with an embodiment of the present disclosure, an integrated circuit capacitor structure includes a first electrode comprising a cylindrical column, a ferroelectric layer around an exterior sidewall of the cylindrical column and a plurality of outer electrodes. Each of the plurality of outer electrodes are electrically isolated from each other. In one embodiment, the plurality of outer electrodes includes a first outer electrode that is laterally adjacent to a first portion of an exterior of the ferroelectric layer and a second outer electrode that is laterally adjacent to a second portion of the exterior of the ferroelectric layer. In one embodiment, the second outer electrode is above the first outer electrode. The polarization over a first spatial region in the ferroelectric layer between the first electrode and the first outer electrode corresponds to a first memory storage bit, and the polarization over a second spatial region in the ferroelectric layer between the first electrode and the second outer electrode corresponds to a first memory storage bit. The first electrode, the first portion of the ferroelectric layer and the first outer electrode comprise a first ferroelectric capacitor and the first electrode, the second portion of the ferroelectric layer and the second outer electrode comprise a second ferroelectric capacitor.

Because the first outer electrode and the second outer electrode are spatially isolated the direction of polarization may be independently set in the corresponding ferroelectric capacitors. When voltage is applied between a first electrode and a first outer electrode, the voltage across the first ferroelectric capacitor may not modify the second ferroelectric capacitor up to a percentage of a maximum programmable voltage. In embodiments, the voltage across a selected ferroelectric capacitor may not disturb a non-selected ferroelectric capacitor by up to 75% of the maximum programmable voltage.

FIG. 1A illustrates a cross-sectional view of an integrated circuit capacitor structure including 100A, in accordance with an embodiment of the present disclosure. The integrated circuit capacitor structure 100A includes an electrode 102 comprising a cylindrical column, a ferroelectric layer 104 around an exterior sidewall of the electrode 102 and a plurality of outer electrodes 106. Each of the outer electrodes in the plurality of outer electrodes 106 are electrically isolated from each other. As shown, the plurality of outer electrodes 106 includes an outer electrode 108 that is laterally adjacent to a portion 104A of an exterior of the ferroelectric layer 104 (herein ferroelectric portion 104A) and an outer electrode 110 that is laterally adjacent to a portion 104B of the exterior of the ferroelectric layer 104 (herein ferroelectric portion 104B). In one embodiment, the second outer electrode 110 is above the first outer electrode 108, as shown.

Figure 1B:
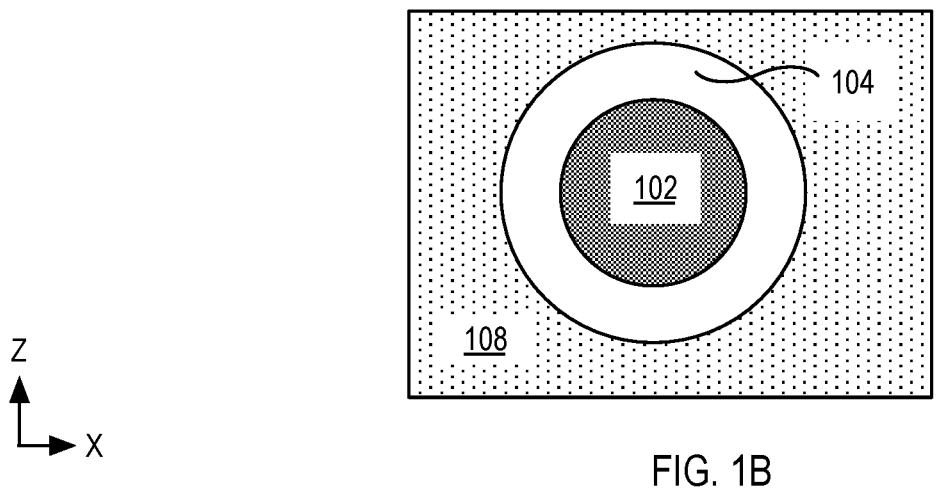
FIG. 1B illustrates a plan view through a horizontal plane of the capacitor structure in FIG. 1A.

FIG. 1B is a plan view illustration of the structure in FIG. 1A, along a horizontal plane midway through electrode 108. In the illustrative embodiment, the electrode 102 has a circular cross section and the ferroelectric layer 104 is substantially conformal around the electrode 102.

Referring again to FIG. 1A, In an embodiment, the ferroelectric layer 104 includes a material that has a spontaneous polarization over a temperature range. A single crystal form can advantageously provide ordered domains over a vertical extent (along the Y-direction) of the ferroelectric layer 104. At a Curie temperature, $T_C$, the ferroelectric layer 104 can undergo a phase transition between an ordered and disordered states, where the dielectric constant can change by orders of magnitude. In an embodiment, the ferroelectric layer 104 has a thickness between 2 nm and 50 nm, and where in the ferro electric material includes hafnium zirconium oxide (HfZrO, also referred to as HZO, which includes hafnium, zirconium, and oxygen), silicon-doped (Si-doped) hafnium oxide (which is a material that includes hafnium, oxygen, and silicon), germanium-doped (Ge-doped) hafnium oxide (which is a material that includes hafnium, oxygen, and germanium), aluminum-doped (Al-doped) hafnium oxide (which is a material that includes hafnium, oxygen, and aluminum), yttrium-doped (Y-doped) hafnium oxide (which is a material that includes hafnium, oxygen, and (yttrium), lead zirconate titanate (which is a material that includes lead, zirconium, and titanium), barium zirconate titanate (which is a material that includes barium, zirconium and titanium), and combinations any combination of these. Some embodiments include hafnium, zirconium, barium, titanium, and/or lead, and any combinations of these materials.

Depending on the material and thickness of the ferroelectric layer 104, domains within ferroelectric layer portions 104A and 104B may be between 2 nm and 50 nm. Vertical thickness (along Y-direction) of the outer electrode 108 may depend on a vertical extent of a smallest domain in the ferroelectric layer portion 104A. In the illustrative embodiment, the outer electrode 108 has a vertical thickness, $H_1$ as measured from a lowermost surface 108A of the outer electrode 108. The ferroelectric layer portion 104A, has a vertical thickness, as measured from a lower most surface 108A that is equal to the vertical thickness, $H_1$. The ferroelectric layer portion 104A that is between the electrode 102 and outer electrode 108 corresponds to a first memory storage bit.

In the illustrative embodiment, the outer electrode 110 has a vertical thickness, $H_2$, as measured from a lower most surface 110A of the outer electrode 110. The ferroelectric layer portion 104B, also has a height, $H_2$ as measured from the lower most surface 110A that is equal to the vertical thickness, $H_2$. The ferroelectric layer portion 104B that is between the electrode 102 and outer electrode 110 corresponds to a second memory storage bit.

In the illustrative embodiment, there are two outer electrodes 108 and 110, respectively. The number of outer electrodes along a height, $H_C$, of the electrode 102 may range from 2-8. For a fixed $H_C$, number of outer electrodes such as electrode 108 or 110, can be increased by decreasing height of one or more electrodes. Alternatively, $H_C$ can be increased to be adjacent to more than 2 outer electrodes.

In the illustrative embodiment, the ferroelectric layer 104 around an exterior sidewall of the cylindrical column has a vertical thickness, $H_F$. As shown, $H_F$ is greater than the combined sum of $H_1$ and $H_2$. Depending on embodiments, sum of $H_1$ and $H_2$ is between 90% and 95% of $H_F$.

Because the outer electrode 108 and the outer electrode 110 are spatially and electrically isolated, the direction of polarization can be independently set in the ferroelectric layer portion 104A and ferroelectric layer 104B. As shown, the outer electrode 108 is vertically spaced apart from the outer electrode 110 by a separation $S_V$. $S_V$ may be determined by coupling capacitance between electrode 108 and 110 which may impact read/write operations (RC delays). In an embodiment, $S_V$ is at least 5 nm. In the illustrative embodiment, a dielectric 112 is directly adjacent to adjacent to the ferroelectric layer portion 104C and vertically between the outer electrode 108 and outer electrode 110. The dielectric 112 has a thickness that is equivalent to $S_V$.

In the illustrative embodiment, to facilitate contact with terminals, the two outer electrodes 108 and 110 have a staircase shape. As shown, the outer electrode 110 extends laterally beyond (along the x-direction) the outer electrode 108. A first contact 114 is on coupled with the outer electrode 108 and a second contact 116 is coupled with the outer electrode 110. In the illustrative embodiment, second contact is laterally between electrode 102 and the first contact 114.

The electrode 102 is further coupled with a conductive interconnect 118. The conductive interconnect 118 has a lateral width, $W_C$, and the electrode 102 has a lateral width $W_E$, as shown. Depending on embodiments, $W_C$ is greater than or less than $W_E$. The conductive interconnect 118 may be coupled with a transistor (not shown). As shown, dielectric 122 is adjacent to the conductive interconnect 118 and a dielectric 124 is between the outer electrode 108 and dielectric 122. In the illustrative embodiment, dielectric 124 is also laterally adjacent to the electrode 102 and directly below and in contact with ferroelectric layer 104. The dielectric 124 may facilitate as an etch stop layer as well as a copper diffusion barrier layer.

In embodiments, the outer electrode 108 and outer electrode 110 include titanium, tantalum, tungsten, ruthenium, or nitrides of titanium, tantalum, tungsten, ruthenium.

In embodiments, electrode 102 includes titanium, tantalum, tungsten, ruthenium, copper, or nitrides of titanium, tantalum, tungsten, ruthenium. In some embodiments, electrodes 302, 304 and 306 include a same material.

In an embodiment, the conductive interconnect 118 includes a liner layer 118A and a fill metal 118B on the liner layer 118A, as shown. In an embodiment, the liner layer 118A includes one or more of Ti, Ta, Ru or Al. The fill metal 118B may include a material such as W or Cu.

In embodiments, dielectric layers 124 and 112 include silicon and one or more of nitrogen and carbon such as, silicon nitride, carbon doped silicon nitride or silicon carbide.

In embodiments, dielectric layer 122 includes silicon and one or more of nitrogen, oxygen and carbon such as, silicon nitride, silicon dioxide, carbon doped silicon nitride, silicon oxynitride or silicon carbide.

In embodiments contacts 114 and 116 include titanium, tantalum, tungsten, ruthenium, copper, or nitrides of titanium, tantalum, tungsten, ruthenium. In other embodiments the contacts 114 and 116 include a liner layer including ruthenium or tantalum and a fill metal such as copper or tungsten.

Figure 1C:
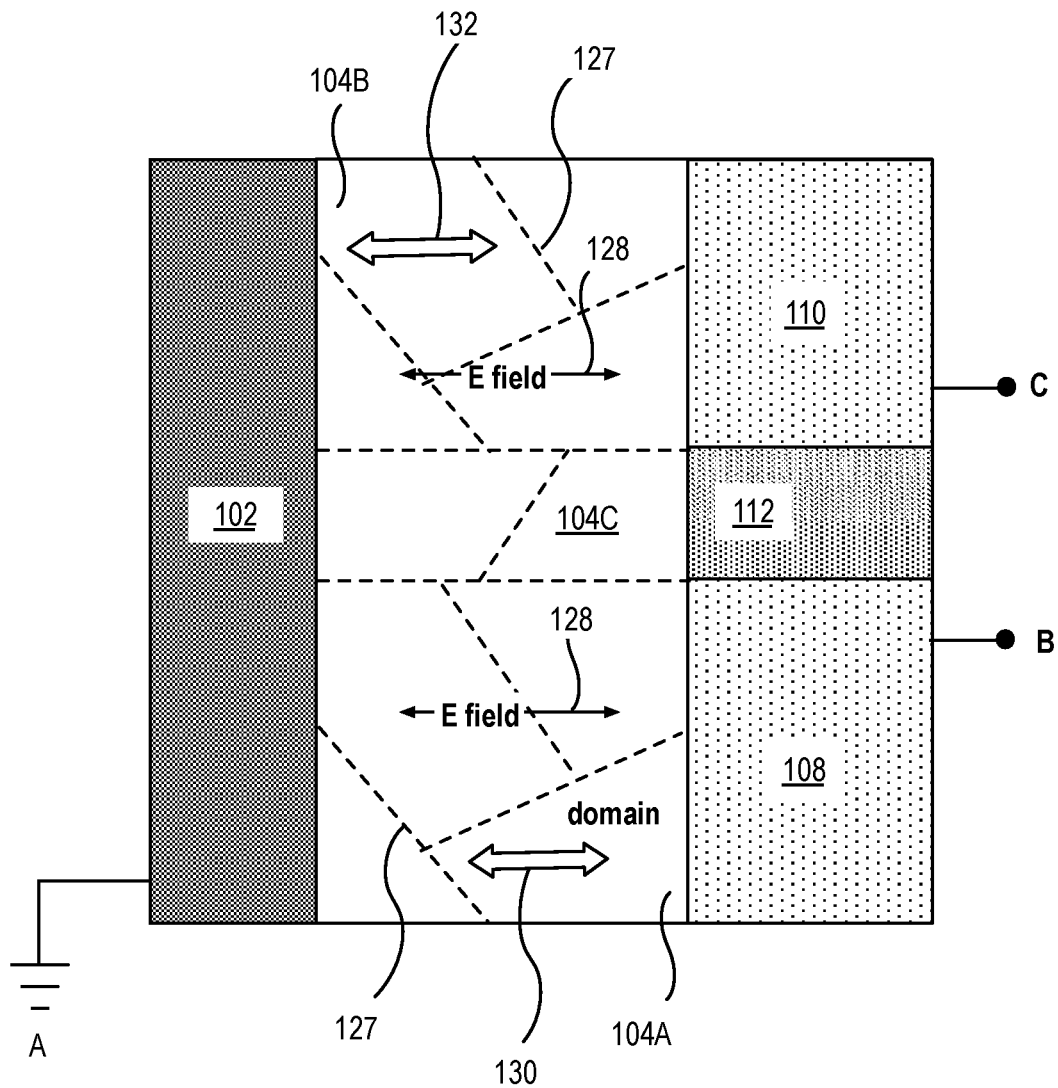
FIG. 1C illustrates an enhanced cross-sectional view of a section of the integrated circuit capacitor structure in FIG. 1A.

FIG. 1C is a cross sectional illustration of a section (inside dashed box 126) of the structure in FIG. 1A. The ferroelectric layer portion 104A may include one or more domains. As shown, ferroelectric layer portions 104A and 104B each includes a plurality of domains (separated by the dashed lines 127 in each respective portion 104A and 104B). The domains in ferroelectric layer portions 104A can respond to an external electric field 128 when a potential difference is applied between the electrode 102 (terminal A) and outer electrode 108 (terminal B) during operation. The ferroelectric layer portion 104A has an average intrinsic polarization indicated by arrow 130, that can respond to the external applied electric field 128. In the cross-sectional embodiment, the average polarization can orient in the +/−X direction as indicated by the bidirectional arrow 130.

The domains in ferroelectric layer portions 104B can respond to an external electric field 128 when a potential difference is applied between the electrode 102 (terminal A) and outer electrode 110 (terminal C) during operation. The ferroelectric layer portion 104B has an average intrinsic polarization indicated by bidirectional arrow 132, that can respond to the external applied electric field 128. In the cross-sectional embodiment, the average polarization can orient in the +/−X direction as indicated by the bidirectional arrow 132. The potential difference can be applied independently between electrode 110 and electrode 108, so the electrical field can be localized within ferroelectric layer portion 104A or 104B.

The applied electric field 128 does not appreciably affect an intrinsic polarization in the ferroelectric layer portion 104C, because of low levels of fringing fields within ferroelectric layer portion 104C. The thickness of the dielectric layer 112 can control the extent of fringing fields within ferroelectric layer portion 104C.

In some embodiments, the integrated circuit capacitor structure includes one or more layers between the electrode 102 and the ferroelectric layer 104.

Figure 1D:
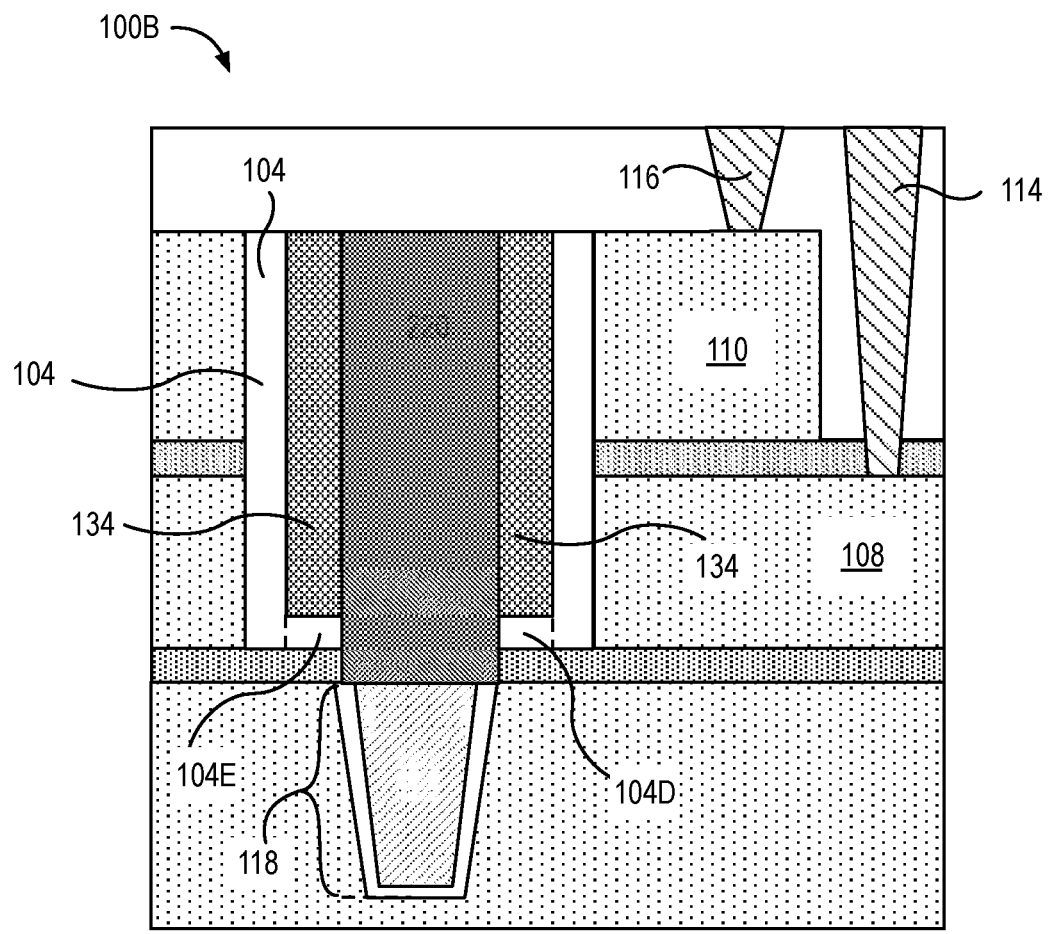
FIG. 1D illustrates a cross-sectional view of an integrated circuit capacitor structure including a ferroelectric layer, in accordance with an embodiment of the present disclosure.

FIG. 1D is a cross-sectional illustration of an integrated circuit capacitor structure 100B, that includes a liner layer 134 between the electrode 102 and the ferroelectric layer 104. The liner layer 134 may be implemented to facilitate one or more processing operations as will be discussed below. In an embodiment, the liner layer 134, has a lateral thickness between 2 nm and 10 nm.

Where integrated circuit capacitor structure 100B includes liner layer 134, the ferroelectric layer 104 may have a portion that is under the liner layer 134. In the illustrative cross-sectional embodiment, the ferroelectric layer 104 has a lateral portion 104D and a lateral portion 104E under the liner layer 134.

The liner layer 134 may include a material that is the same or substantially the same as the material of the electrode 102. In other embodiments, the liner layer 134 includes a material that facilitates that offers process benefits. In some such embodiments, the liner layer 134 includes a material such as ruthenium, tungsten, titanium, tantalum, or nitrides of tungsten, titanium or tantalum.

FIGS. 2A-2H illustrate numerous operations to fabricate the integrated circuit capacitor structure 100B (described in FIG. 1D), in accordance with an embodiment of the present disclosure.

Figure 2A:
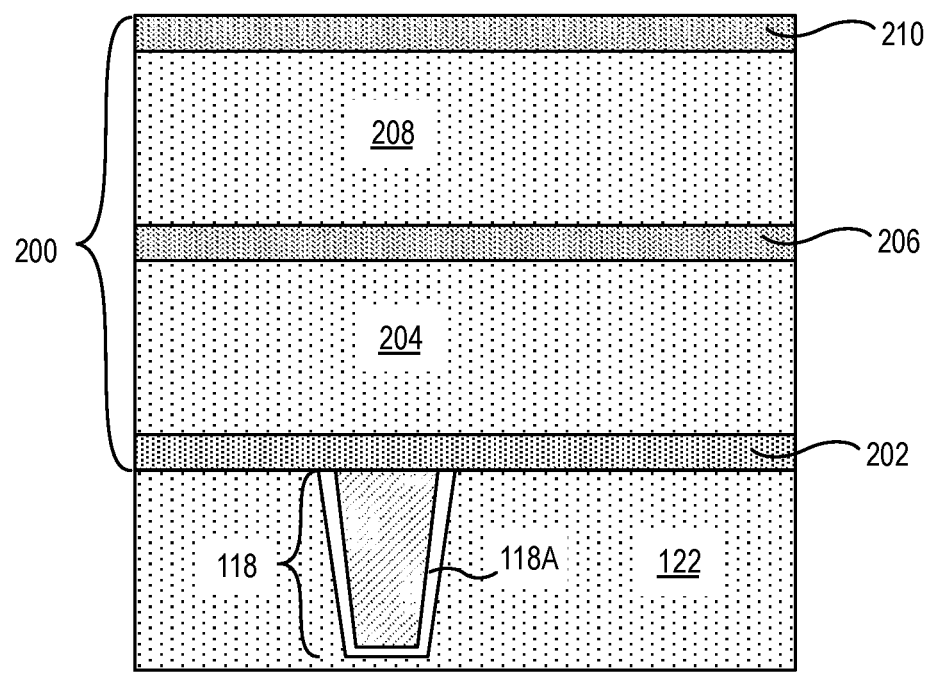
FIG. 2A illustrates a material layer stack formed above a conductive interconnect.

FIG. 2A illustrates a material layer stack 200 formed above a conductive interconnect 118. In the illustrative embodiment, forming the material layer stack 200 includes depositing a dielectric layer 202 on the conductive interconnect 118, and on the dielectric 122. In an embodiment, the dielectric layer 202 is blanket deposited by a (PECVD) or a chemical vapor deposition (CVD) process. In an embodiment, the dielectric layer 202 includes silicon and at least one of nitrogen, or carbon, for example, silicon nitride, or silicon carbide. The dielectric layer 202 acts an etch stop during formation of a central electrode structure. A metal electrode layer 204 is blanket deposited on the dielectric layer 202. The electrode layer 204 includes a material that is the same or substantially the same as the material of the outer electrode 108 or outer electrode 110. The electrode layer 204 may be blanket deposited using a physical vapor deposition (PVD) process, or a CVD process to a thickness between 50 nm to 300 nm. A dielectric layer 206 is blanket deposited on the electrode layer 204. In embodiments, dielectric layer 206 includes a material that is the same or substantially the same as the material of the dielectric 202. In an embodiment, dielectric layer 206 is deposited in the same manner as dielectric layer 202. The dielectric layer 206 is deposited to a thickness that is sufficient to provide electrical isolation between metal electrode layer 204 and another conductive material above. As shown, an metal electrode layer 208 is blanket deposited on the dielectric layer 206. In an embodiment, the electrode layer 208 includes a material that is the same or substantially the same as the material of the outer electrode 108 or outer electrode 110. The electrode layer 208 may be blanket deposited using a PVD, or a CVD process to a thickness between 50 nm to 300 nm. The process of forming the material layer stack 200 further includes deposition of a dielectric layer 210. In an embodiment, dielectric layer 210 is blanket deposited on the electrode layer 208. In embodiments, dielectric layer 210 includes a material that is the same or substantially the same as the material of the dielectric 202. In an embodiment, dielectric layer 210 is deposited in the same manner as dielectric layer 202. The dielectric layer 210 is deposited to a thickness that is sufficient to provide a planarization stop surface, such as a thickness between 5 nm and 100 nm.

Figure 2B:
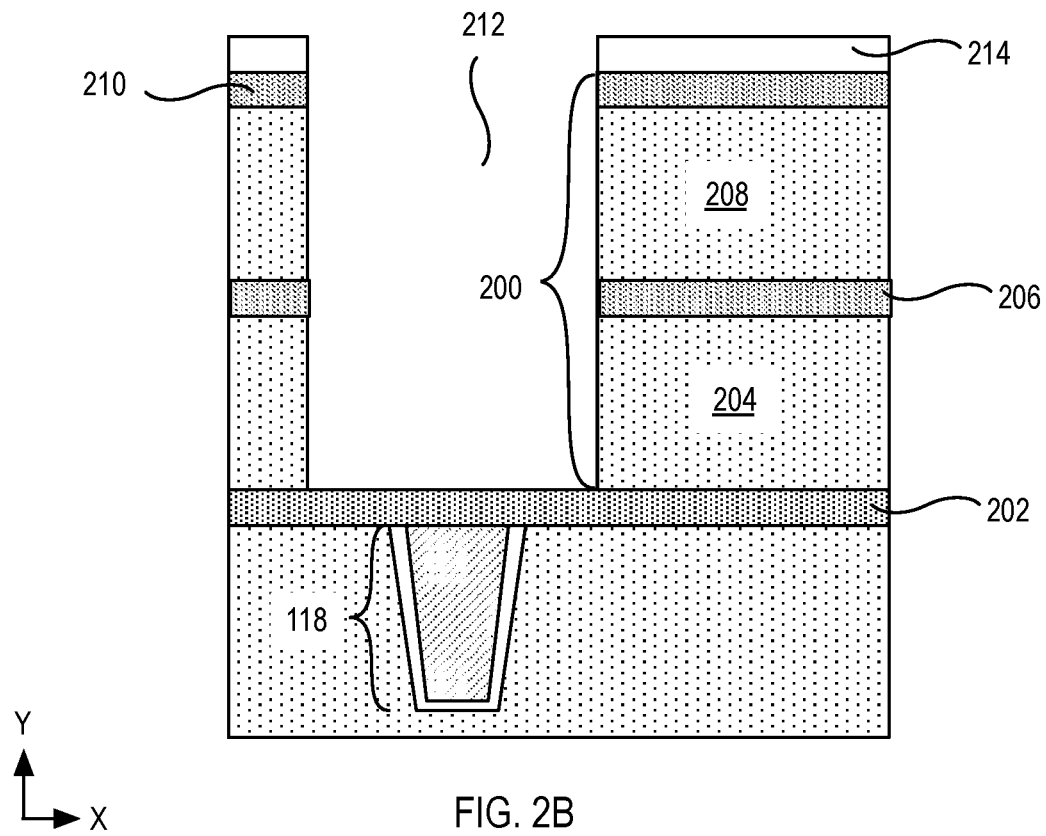
FIG. 2B is a cross-sectional illustration of the structure of FIG. 2A following the formation of an opening in the material layer stack.

FIG. 2B is a cross-sectional illustration of the structure of FIG. 2A following the formation of an opening 212 in the material layer stack 200. In an embodiment, a mask 214 is formed on the dielectric layer 210. The mask 214 defines locations for a central electrode to be formed. In an embodiment, a plasma etch process is utilized to sequentially etch the dielectric layer 210, the metal electrode layer 208, the dielectric layer 206 and the metal electrode layer 204. The plasma etch is halted after exposure of the dielectric layer 202 so that the conductive interconnect 118 is not exposed. The mask 214 may be removed after the etch process.

Figure 2C:
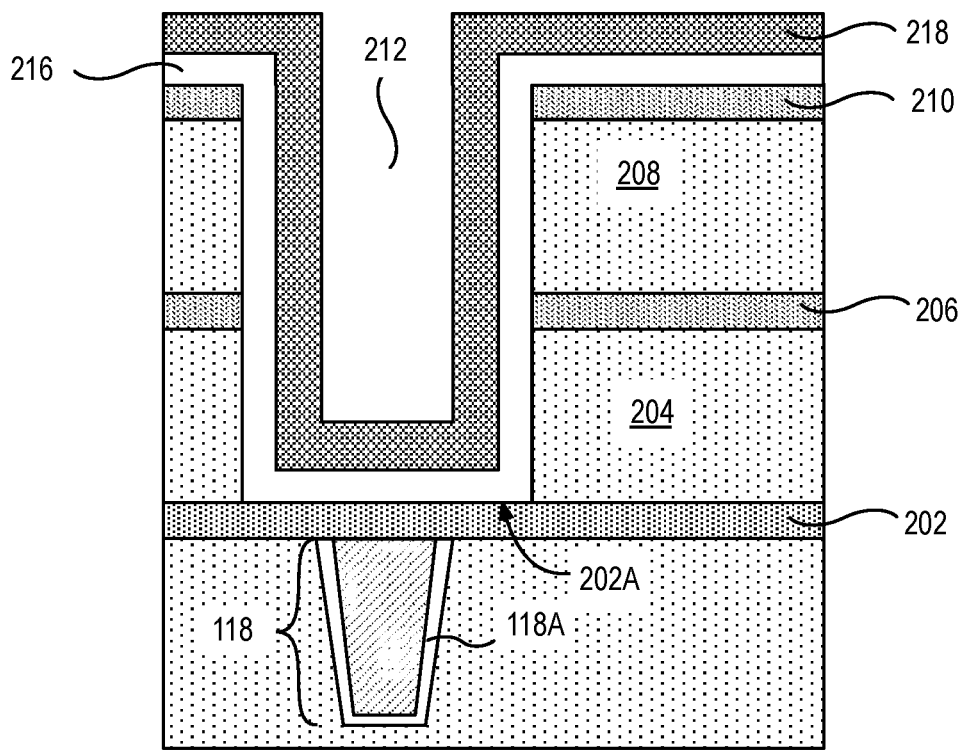
FIG. 2C is a cross-sectional illustration of the structure of FIG. 2B following the formation of a ferroelectric layer in the opening.

FIG. 2C is a cross-sectional illustration of the structure of FIG. 2B following the formation of a ferroelectric layer 216 in the opening 212. In an embodiment, the ferroelectric layer 216 is blanket deposited on a top surface 202A of the dielectric layer 202. On sidewalls of the dielectric layer 210, the electrode layer 208, the dielectric layer 206, on the electrode layer 204 and on a top surface of dielectric layer 210. In an embodiment, the ferroelectric layer 216 includes a material that is the same or substantially the same as the material of the ferroelectric layer 104. The ferroelectric layer 216 is deposited to a thickness of 2 nm to 20 nm. In an embodiment, a physical vapor deposition process is utilized to blanket deposit ferroelectric layer 216. The In an embodiment, an atomic layer deposition (ALD) process may be utilized to deposit the ferroelectric layer 216.

An electrode layer 218 is then blanket deposited on all exposed surfaces of the ferroelectric layer 216. In an embodiment, the electrode layer 218 includes a material such as ruthenium, tungsten, titanium, tantalum, or nitrides of tungsten, titanium or tantalum.

After deposition a high temperature anneal is performed to crystallize the ferroelectric layer 216. In an embodiment, substrate housing the structure in FIG. 2C is heated. In an embodiment, where ferroelectric layer 216 includes a material that is in single or poly crystalline form and has a spontaneous polarization that are directed in various directions. There may not be a net polarization in the ferroelectric layer 216. Polarization can vary across different domains in the ferroelectric layer 216. As the substrate is heated, at a temperature corresponding to a Curie temperature, $T_C$, ferroelectric layer 216 can undergo a phase transition between an ordered and disordered states, where the dielectric constant can change by orders of magnitude. The substrate can then be cooled. In an embodiment, an external electric field may be applied to set a uniform direction of polarization during the cooling process. The ferroelectric layer 216 is poled, where a remnant polarization is set.

As shown, a lateral width of the opening 212 is reduced after formation of the ferroelectric layer 216 and the electrode layer 218.

Figure 2D:
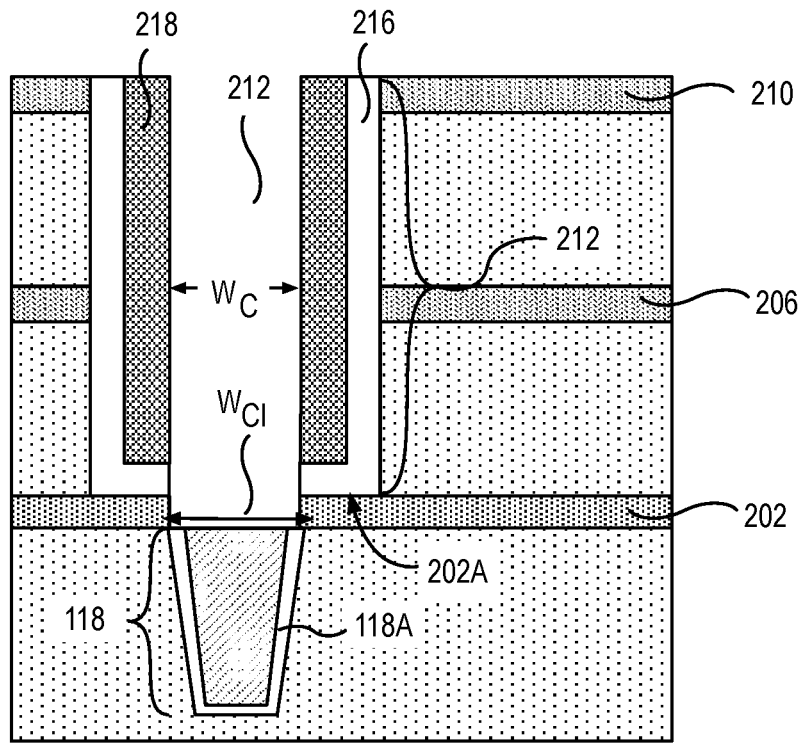
FIG. 2D is a cross-sectional illustration of the structure of FIG. 2C following the process to etch and remove an electrode layer from above the ferroelectric layer in the opening.

FIG. 2D is a cross-sectional illustration of the structure of FIG. 2C following the process to etch and remove the electrode layer 218 from above the ferroelectric layer 216 in the opening 212 and above the dielectric layer 210. In an embodiment, a plasma etch process may be utilized. The ferroelectric layer 216 is subsequently etched from in the opening above the dielectric layer 202 and from above the dielectric layer 210. The dielectric layer 202 functions as an etch stop layer during etching of the ferroelectric layer 216. An etch stop layer can be important if the material of the conductive interconnect 118 includes copper. In an embodiment, an "L" shaped ferroelectric layer 216 is formed after the etch process, where a lateral portion of the ferroelectric layer 216 is under the electrode layer 218, as shown.

A plasma etch process that is selective to the dielectric layer 202 may be utilized to etch the dielectric layer 202 that is exposed after etching the ferroelectric layer 216 in the opening 212. An entire upper surface of the conductive interconnect 118 may be exposed after etching of the dielectric layer 202. Whether an entire upper surface or a portion of the conductive interconnect 118 is exposed may depend on a lateral width, $W_{CI}$, of the opening 212, and on a lateral width, $W_{CI}$, of the conductive interconnect 118.

Figure 2E:
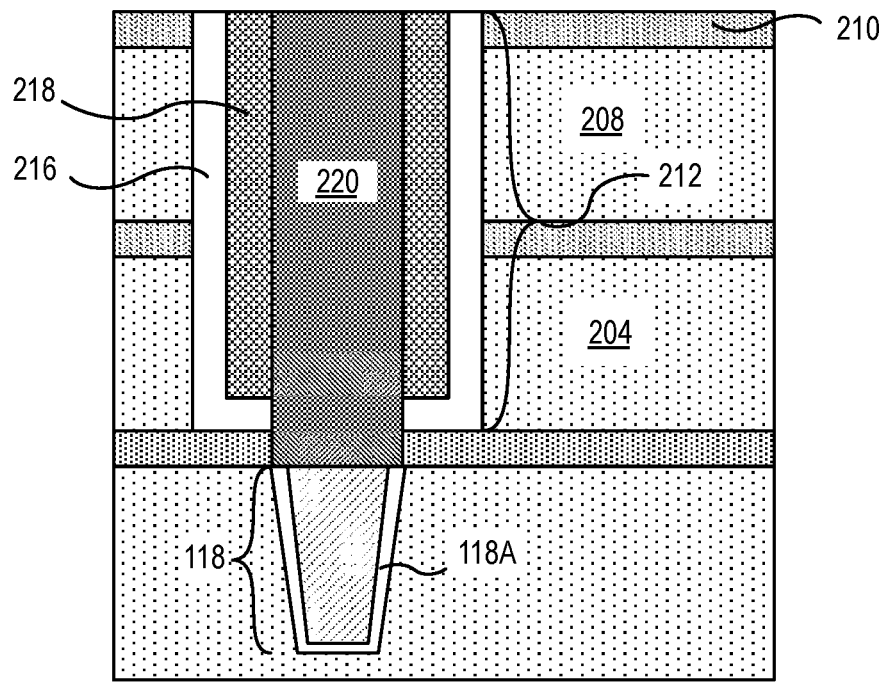
FIG. 2E is a cross-sectional illustration of the structure of FIG. 2D following the formation of a central electrode structure

FIG. 2E is a cross-sectional illustration of the structure of FIG. 2D following the formation of a central electrode structure 220. In an embodiment, an electrode layer is deposited into the opening 212 on a top surface of the conductive interconnect 118, and on the dielectric layer 210 and on top portions of the ferroelectric layer 216 and the electrode layer 218. In an embodiment, the electrode layer includes a material that is the same or substantially the same as the material of the electrode 102 described above. A planarization process may be performed, for example, to remove the electrode layer from above the dielectric layer 210. In an embodiment, the planarization process includes a chemical mechanical planarization (CMP) process. The process of planarization forms an electrode 220.

Figure 2F:
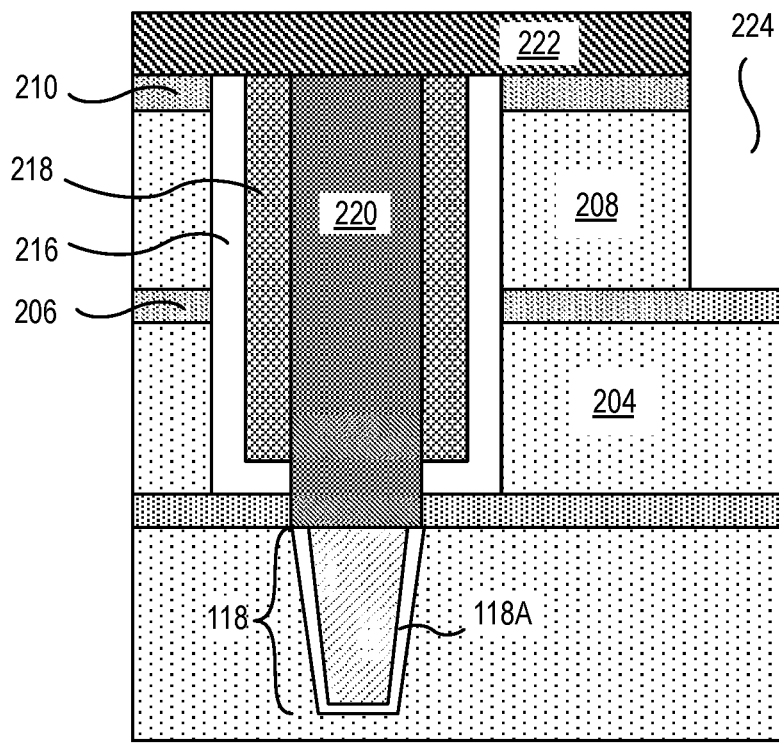
FIG. 2F illustrates the structure of FIG. 2E following the formation of a mask.

FIG. 2F is a cross-sectional illustration of the structure of FIG. 2E following the formation of a mask 222 on the electrode 220, upper portions of ferroelectric layer 216 and electrode layer 218 and on the dielectric layer 210. The mask 222 defines a location for forming a contact to couple with the electrode layer 204. In an embodiment, a plasma etch that is similar to the plasma etch is utilized to form the opening 212, described above, is utilized. An opening 224 is formed by etching portions of each of the dielectric layer 210 and the electrode layer 208.

Figure 2G:
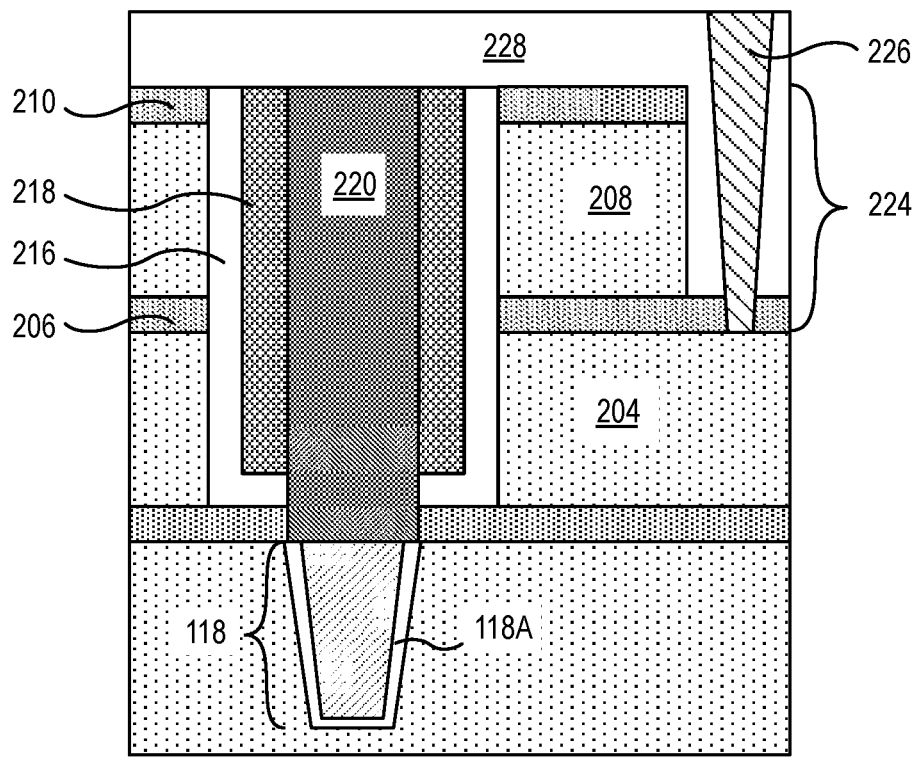
FIG. 2G is a cross-sectional illustration of the structure of FIG. 2F following the formation of a contact structure on a first outer electrode to connect to a first ferroelectric capacitor layer.

FIG. 2G is a cross-sectional illustration of the structure of FIG. 2F following the formation of a contact structure 226. In an embodiment, a dielectric 228 is formed in the opening 224 and on the dielectric layer 210, on top surface of the electrode 220, and on top portions of the ferroelectric layer 216 and the electrode layer 218. In an embodiment, an opening is formed in the dielectric 228 and contact electrode material is deposited in the opening and on an uppermost surface of the dielectric 228. In an embodiment, the contact electrode material includes a material that is the same or substantially the same as the material of the conductive interconnect 118. After the contact electrode material is deposited, a planarization process may be carried out to form the contact structure 226 by removing any excess contact electrode material from the uppermost surface of the dielectric 228.

Figure 2H:
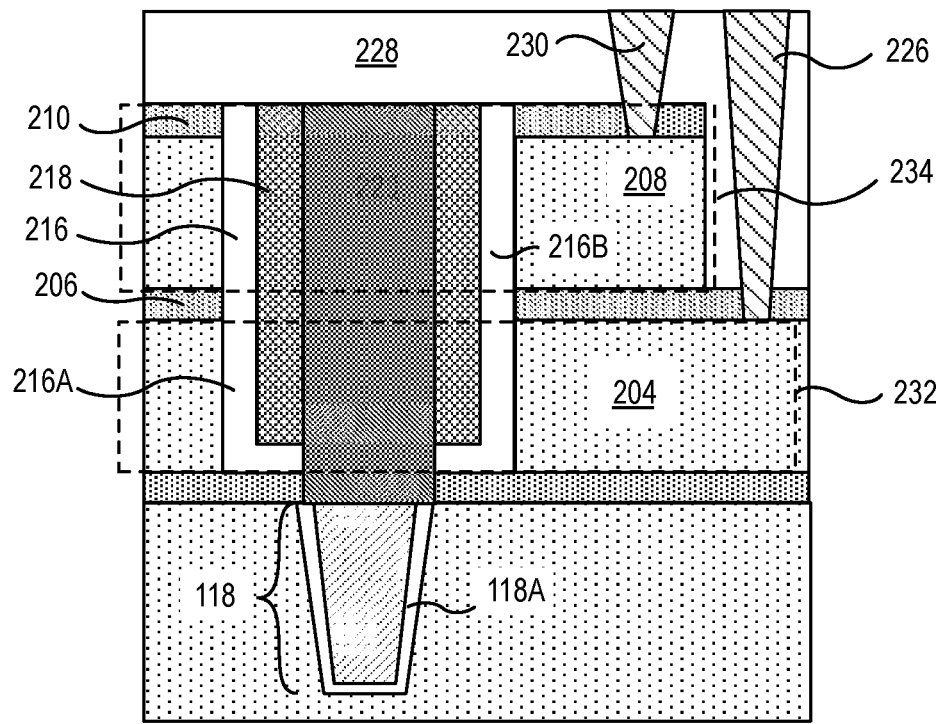
FIG. 2H illustrates the structure of FIG. 2G following the formation of a contact structure on a second electrode to connect to a second ferroelectric capacitor layer.

FIG. 2H illustrates the structure of FIG. 2G following the formation of a contact structure 230 on the electrode layer 208. In an embodiment, contact 230 is formed by etching an opening in the dielectric 228 and in the dielectric layer 210. In an embodiment, a contact electrode material is deposited in the opening and on an uppermost surface of the dielectric 228. In an embodiment, the contact electrode material includes a material that is the same or substantially the same as the material of contact structure 226. After the contact electrode material is deposited, a planarization process may be carried out to form the contact structure 230 by removing any excess contact electrode material from the uppermost surface of the dielectric 228.

Formation of the contact strucures 226 and 230 enables two independently programmable capacitors 232 and 234 as indicated by the dashed boxes. As shown, capacitor 232 includes electrode 220, ferroelectric layer portion 216A and electrode 204, and capacitor 232 includes electrode 220, ferroelectric layer portion 216B and electrode 208. The electrode 220 and conductive interconnect 118 are shared by capacitors 232 and 234.

In other embodiments, an area spanned by the ferroelectric layer between two voltage programmable electrodes may be increased by forming lateral portions of a central electrode that extend away from an axis of the central electrode. By increasing a contact area between the ferroelectric layer and the two programmable electrodes, capacitance may be increased in a multi-level programmable capacitor structure.

Figure 3:
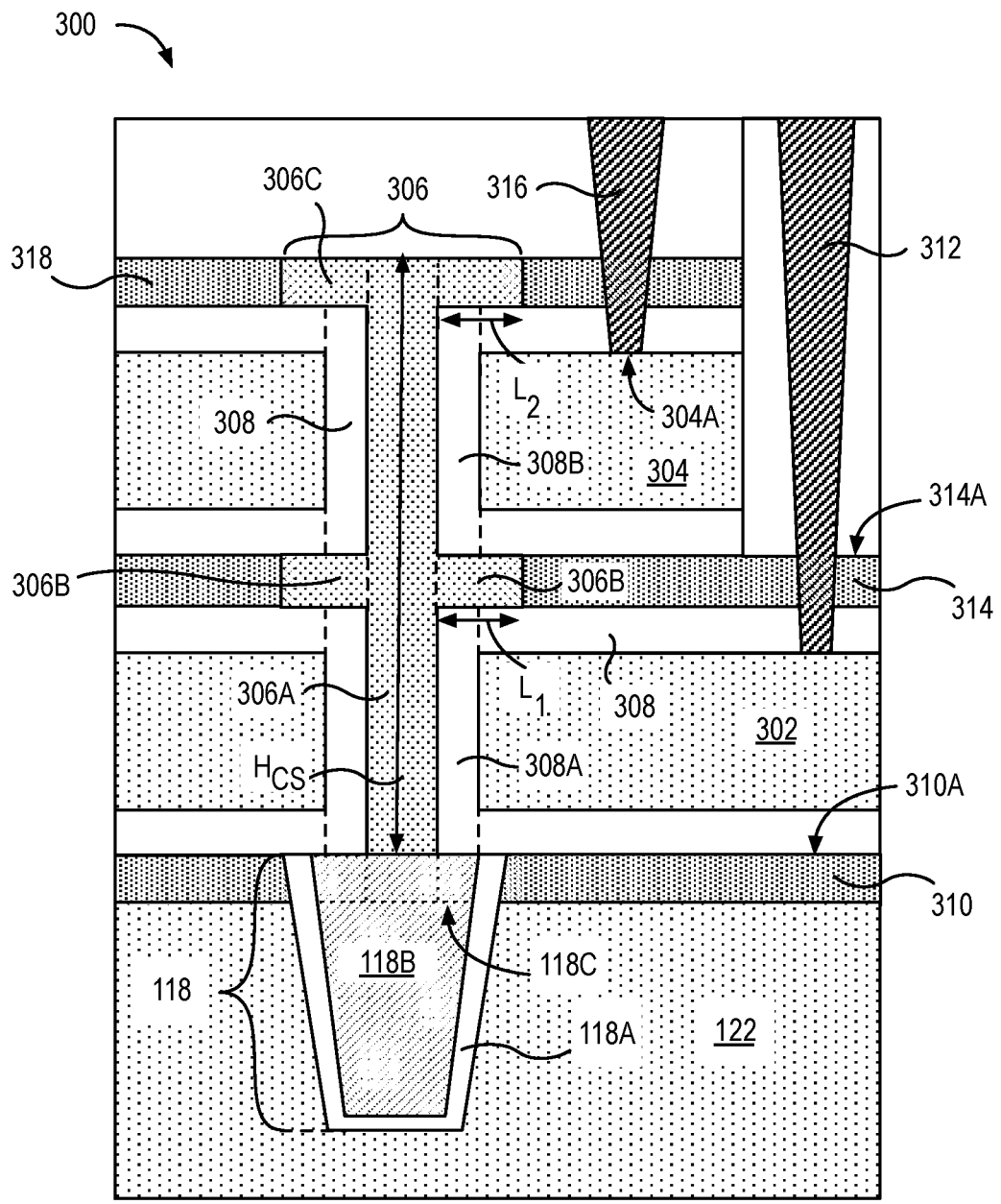
FIG. 3 is a cross-sectional illustration of an integrated circuit capacitor structure, in accordance with an embodiment of the present disclosure.
Figure 3:
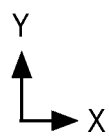

FIG. 3 is a cross-sectional illustration of an integrated circuit capacitor structure 300. In the illustrative embodiment, the integrated circuit capacitor structure 300 includes an electrode 302 comprising a metal feature such as a plate or a line below an electrode 304 comprising a metal feature such as a plate or a line. The integrated circuit capacitor structure 300 further includes an electrode 306, with a columnar electrode 306A, through the electrode 302 and the electrode 304. As shown, the electrode 306 includes a plurality of lateral extensions 306B and 306C that are vertically spaced apart along a height, $H_{CS}$, of the columnar structure 306A. $H_{CS}$, is measured from an uppermost surface 118C of the conductive interconnect 118. The electrode 302 is adjacent to the columnar electrode 306A and under lateral extension 306B. As shown, electrode 304 is adjacent to the columnar electrode 306A above the lateral extension 306B and below a lateral extension 306C. The integrated circuit capacitor structure further includes a ferroelectric layer 308 between electrode 306 and electrode 302 and between electrode 306 and 304. In an embodiment, electrode 302 and 306 are vertically separated by at least 5 nm.

In the illustrative embodiment, the lateral extension 306B laterally extends over the electrode 302 and under the electrode 304. As shown the lateral extension 306B extends a distance, $L_1$, beyond an exterior sidewall of the columnar electrode 306A.

The ferroelectric layer 308 has a vertical portion 308A that extends vertically along the columnar electrode 306A from above an uppermost surface 310A of dielectric layer 310 to a lowermost surface of the lateral extension 306B. The ferroelectric layer 308 extends laterally away from the columnar electrode 306A. The overlap between lateral extension 306B, ferroelectric layer 308 and electrode 302 provides additional capacitance to the integrated circuit capacitor structure 300. As shown, and overlap between conductive interconnect 118, ferroelectric layer 308, and electrode 302 provides additional capacitance benefit. In an embodiment, such as is shown, the ferroelectric layer 308 extends laterally away from the columnar electrode 306A to a contact structure 312 that is coupled with the electrode 302.

In the illustrative embodiment, the lateral extension 306C laterally extends over the electrode 304. As shown the lateral extension 306B extends a distance, $L_2$, beyond an exterior sidewall of the columnar electrode 306A. In embodiments, $L_2$ is the same or substantially the same as $L_1$.

The ferroelectric layer 308 has a vertical portion 308B that extends vertically along the columnar electrode 306A from above an uppermost surface 314A of dielectric layer 314 to a lowermost surface of the lateral extension 306C. The ferroelectric layer 308 also extends laterally away from the columnar electrode 306A, above and below the electrode 310. As shown a overlap between lateral extension 306B, ferroelectric layer 308 and electrode 304, and an overlap between lateral extension 306C, ferroelectric layer 308 and electrode 304 provide additional capacitance to the integrated circuit capacitor structure 300.

In an embodiment, such as is shown, the ferroelectric layer 308 extends laterally away from the columnar electrode 306A to a contact structure 316. In the illustrative embodiment, the the ferroelectric layer 308 also extends laterally beyond contact structure 316 to an edge of the electrode 304. As shown, contact structure 316 is coupled with the electrode 304.

In the illustrative embodiment, to facilitate coupling with contact structures, the electrodes 302 and 304 have a staircase shape. As shown, the electrode 302 extends laterally beyond (along the x-direction) the electrode 304. In the illustrative embodiment, contact 316 is laterally between electrode 306 and the contact structure 312.

In an embodiment, the electrode 306 is further coupled with conductive interconnect 118, as shown. The conductive interconnect 118 may be coupled with a transistor (not shown). As shown, dielectric 122 is adjacent to the conductive interconnect 118, and dielectric layer 310 is between the ferroelectric layer 308 and dielectric 122. In the illustrative embodiment, dielectric 310 is also laterally adjacent to the conductive interconnect 118 and directly below and in contact with ferroelectric layer 308. The dielectric layer 310 may facilitate as an etch stop layer and as well as a copper diffusion barrier layer.

In embodiments, the electrode 302 and electrode 304 include titanium, tantalum, tungsten, ruthenium, or nitrides of titanium, tantalum, tungsten, ruthenium.

In embodiments, electrode 302 includes titanium, tantalum, tungsten, ruthenium, copper, or nitrides of titanium, tantalum, tungsten, ruthenium. In some embodiments, electrodes 302, 304 and 306 include a same material.

In embodiments, dielectric layers 310, 314 and 318 include silicon and one or more of nitrogen and carbon such as, silicon nitride, carbon doped silicon nitride or silicon carbide.

In embodiments, dielectric layers 122 includes silicon and one or more of nitrogen, oxygen and carbon such as, silicon nitride, silicon dioxide, carbon doped silicon nitride, silicon oxynitride or silicon carbide.

In embodiments contacts 312 and 316 include titanium, tantalum, tungsten, ruthenium, copper, or nitrides of titanium, tantalum, tungsten, ruthenium. In other embodiments the contacts 312 and 316 include a liner layer including ruthenium or tantalum and a fill metal such as copper or tungsten.

FIGS. 4A-4F illustrate numerous operations to fabricate the integrated circuit capacitor structure 100B, in accordance with an embodiment of the present disclosure.

Figure 4A:
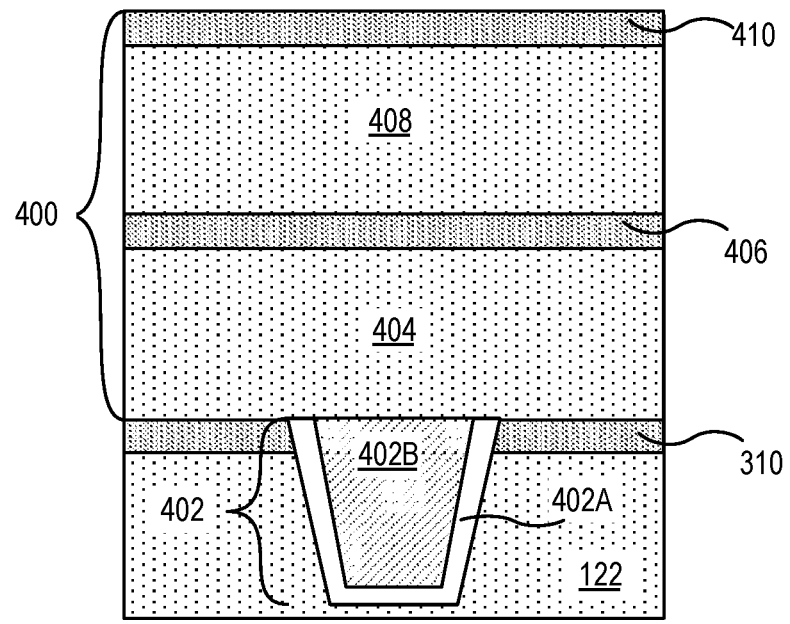
FIG. 4A illustrates a material layer stack formed above a conductive interconnect.

FIG. 4A illustrates a material layer stack 400 formed above a conductive interconnect 402. In the illustrative embodiment, forming the material layer stack 400 includes depositing a dielectric layer 404 on the conductive interconnect 402, and on the dielectric 122. The deposition process continues with the deposition of a dielectric layer 406 on the dielectric layer 404, deposition of a dielectric layer 408 on the dielectric layer 406 and depostion of dielectric layer 410 on the dielectric layer 408. The material of the dielectric layers 310, 406 and 410 are different from the material of dielectric layers 404 and 408, such that either dielectric layer 404 and 408 can be removed or etched selectively dielectric layers 310, 406 and 410.

In an embodiment, the dielectric layers 404, 406, 408 and 410 are blanket deposited by a (PECVD) or a chemical vapor deposition (CVD) process. In an embodiment, the dielectric layers 406 and 410 include silicon and oxygen. The dielectric layer 402 acts an etch stop during formation of a central electrode structure. In exemplary embodiments, the dielectric layers 310, 406 and 410 include a same material. In some embodiments, the dielectric layers 406 and the dielectric layer 410 include a same material. The dielectric layer 410 is deposited to a thickness that is sufficient to provide a planarization stop surface.

In an embodiment, dielectric layer 406 and 410 are deposited to a thickness between [X-Y], where the thicknesses of each layer 402, 406, 410 is the same or different from each other.

Dielectric layers 404 and 408 may include a material that is the same or substantially the same as the dielectric layer 122. In an embodiment, the dielectric layer 404 includes silicon and at least one of nitrogen, or carbon, for example, silicon nitride, or silicon carbide. The dielectric layer 404 may be blanket deposited by a (PECVD) or a chemical vapor deposition (CVD) process to a thickness between 50 nm and 300 nm. The as deposited thickness of dielectric layer 404 and 408 determine a maximum vertical thickness of electrodes and ferroelectric material that can be deposited in a downstream operation.

In an embodiment, the conductive interconnect 402 includes a liner layer 402A and a fill metal 402B on the liner layer 402A, as shown. In an embodiment, the liner layer 402A includes one or more of Ti, Ta, Ru or Al. The fill metal 402B may include a material such as W or Cu.

Figure 4B:
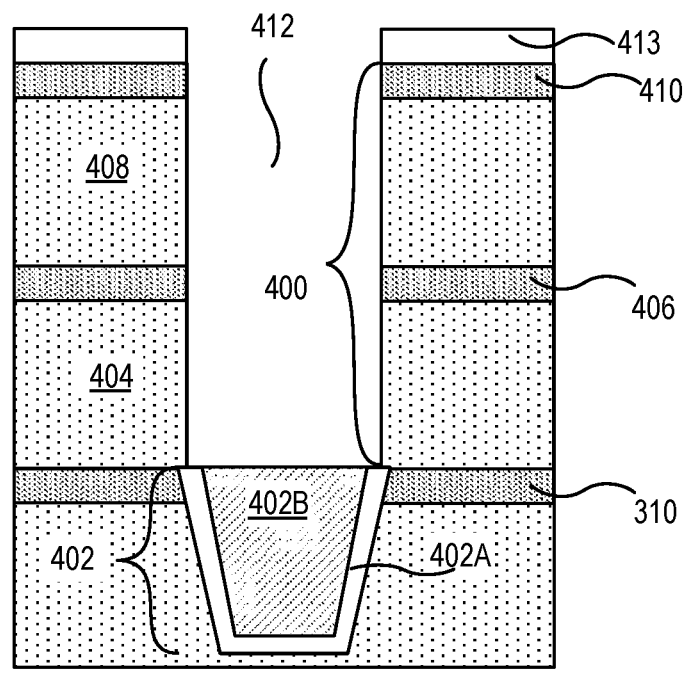
FIG. 4B is a cross-sectional illustration of the structure of FIG. 4A following the formation of an opening in the material layer stack.

FIG. 4B is a cross-sectional illustration of the structure of FIG. 4A following the formation of an opening 412 in the material layer stack 400. In an embodiment, a mask 414 is formed on the dielectric layer 410. The mask 413 defines locations for a central electrode to be formed. In an embodiment, a plasma etch process is utilized to sequentially etch the dielectric layers 408, 406 and 404 to form the opening 412.

In an embodiment, the mask 414 is removed after the plasma etch process partially etches dielectric layer 404. In embodiments, an oxygen plasma may be used to remove mask 413 prior to fully etching dielectric layer 404 when the mask 413 includes a photoresist. The plasma etch process is continued to etch the dielectric layer 402 and expose the conductive interconnect 402.

Figure 4C:
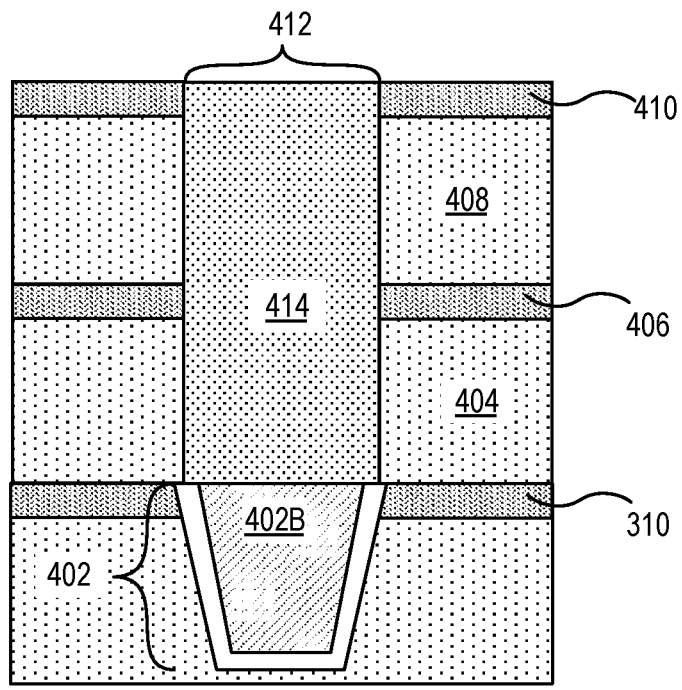
FIG. 4C is a cross-sectional illustration of the structure of FIG. 4B following the formation of an electrode material in the opening.

FIG. 4C is a cross-sectional illustration of the structure of FIG. 4B following the formation of an electrode material in the opening 412.

In an embodiment, the electrode material 414 is blanket deposited on a top surface of the conductive interconnect 402, on a top surface and on sidewalls of the dielectric layer 410, and on sidewall surfaces of dielectric layer 408, dielectric layer 406, and dielectric layer 404. In an embodiment, the electrode material 414 includes a material that is the same or substantially the same as the material of the electrode 420. The electrode material 414 is deposited to fill the opening 412. In an embodiment, a physical vapor deposition process is utilized to blanket deposit the electrode material 414. In an embodiment, an atomic layer deposition (ALD) process may be utilized to deposit the electrode material 414, if the opening has a lateral dimension that is less than 20 nm, for example.

Figure 4D:
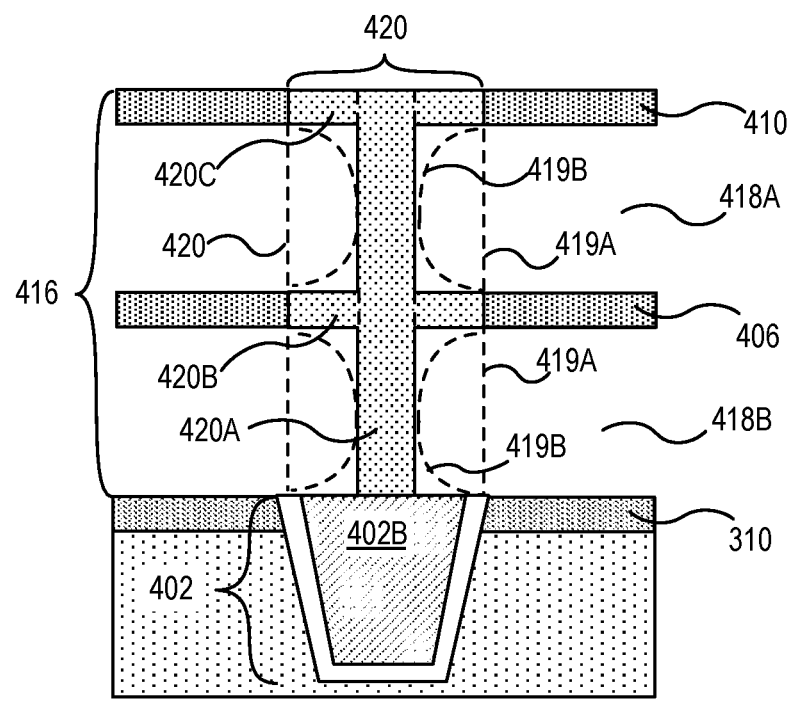
FIG. 4D is a cross-sectional illustration of the structure of FIG. 4C following the process to remove the dielectric layers and form lateral recesses.

FIG. 4D is a cross-sectional illustration of the structure of FIG. 4C following the process to remove the dielectric layers 404 and 408 and form lateral recesses. In an embodiment, prior to the removing dielectric layers 404 and 408, the structure of FIG. 4C (above the dielectric 310) is patterned into a block 416, where the block 416 can be a line or a plate feature having sidewalls. After patterning and creating the block 416, an etch may be utilized to selectively remove dielectric layers 404 and 408 with respect to dielectric layers 402, 406 and 410. In an embodiment, a wet chemical etch is utilized to remove the dielectric layers 404 and 408 (not shown). In an embodiment, etching of dielectric layers 404 and 408 forms a recess 418A between dielectric layers 410 and 406 and a recess 418B between dielectric layers 406 and conductive interconnect 402 and dielectric layer 310. Etching and removing of dielectric layers 404 and 408 exposes sidewalls of the electrode material 414 (indicated by dashed lines 419A).

After removal of dielectric layers 404 and 408, another etch process is utilized to recess the electrode material 414 to form electrode structure 420. The etch process utilized to recess electrode material 414 is selective to dielectric layers 402, 406, and the material of the conductive interconnect 402.

In the illustrative embodiment, the recess forms the electrode structure 420 having a columnar electrode 420A and lateral extensions 420B, 420C and 420D protruding from the columnar structure 420A. As shown the columnar structure 420A has sidewalls that are substantially vertical, and lateral extensions 420B and 420C that have a substantially planar profile (along the X-direction). In other embodiments, the columnar structure 420A has sidewalls that are curved, and lateral extensions 420B and 420C that are also curved as indicated by dashed lines 419AB. In an embodiment, the electrode structure 420 includes an electrode material 414 that is different from the material of the conductive interconnect 402 to advantageously enable formation of electrode structure 420 without eroding the conductive interconnect 402.

Figure 4E:
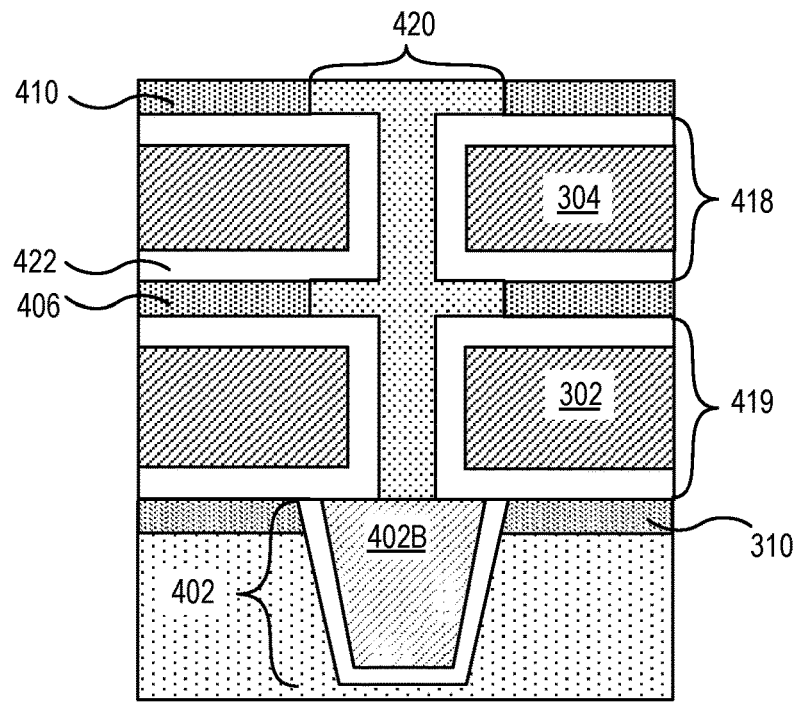
FIG. 4E is a cross-sectional illustration of the structure of FIG. 4D following the formation of a ferroelectric layer in the lateral recess.

FIG. 4E is a cross-sectional illustration of the structure of FIG. 4D following the formation of a ferroelectric layer 422 in the recesses 418A and 418B. In an embodiment, the ferroelectric layer 422 is deposited using an ALD process. The ALD process may advantageously form a conformal ferroelectric layer 422 directly adjacent to the electrode structure 306 in the recesses 418A and 418B. In the illustrative embodiment, the ALD process also deposits the ferroelectric layer 422 on top surface of the dielectric 310, on the conductive interconnect 402, and on the top and bottom surface of dielectric layers 406 and 410 as shown.

In an embodiment, the material utilized to form ferroelectric layer 422 and an anneal process that is performed post deposition is the same as the material utilized and the anneal process that is performed post deposition to form ferroelectric layer 216, as described above.

After formation of the ferroelectric layer 422, an electrode material is deposited into the recesses 418A and 418B. In an embodiment, the electrode material has a material composition that is the same as the material composition of the electrode 302 or 304, described above. In an exemplary embodiment, the electrode material is deposited using an ALD process. An ALD process can advantageously deposit the electrode material adjacent to the ferroelectric layer 422 and fill the recesses 418A and 418B.

In an embodiment, after formation of the ferroelectric layer 422 and the electrode material, a planarization process may be performed to remove the ferroelectric layer 422 and any excess electrode material from above the dielectric layer 410.

In an embodiment, the structure of FIG. 4E is masked and edges of the block 416 are etched to isolate and form electrodes 304 and 306 from each other, as shown. The planarization process and etching ferroelectric layer 422 and the electrode material from the side of the block forms electrodes 304 and 306, as shown.

Figure 4F:
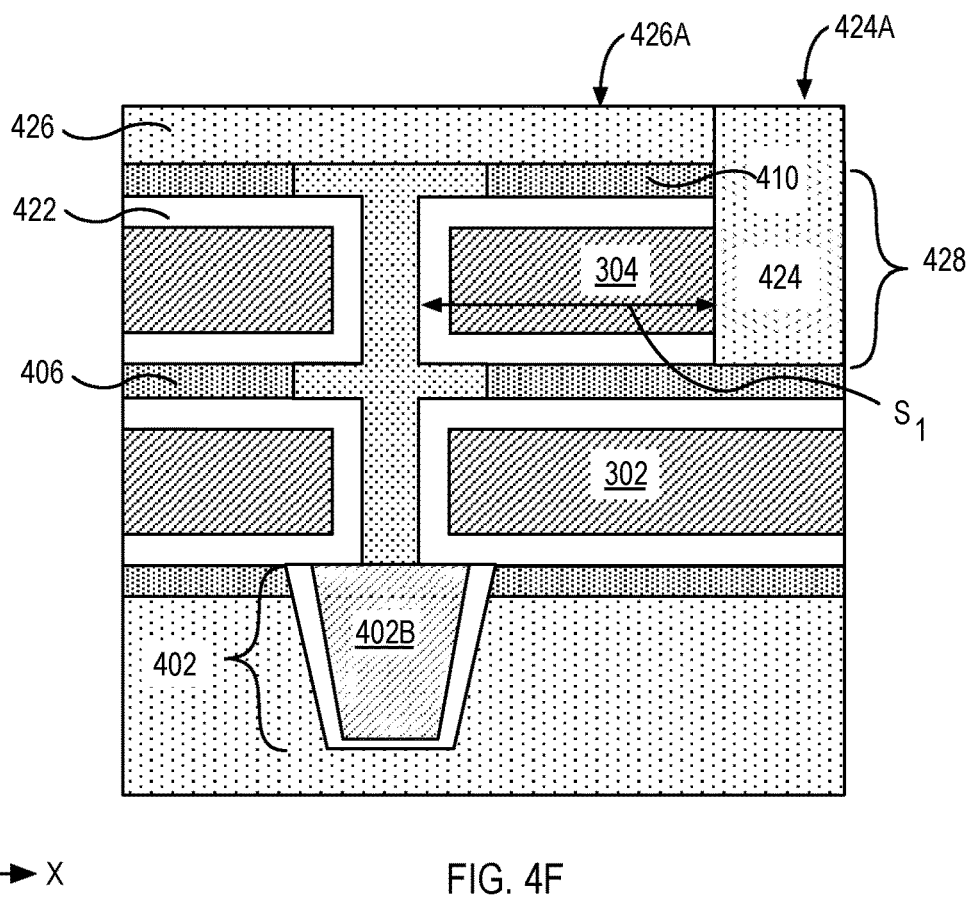
FIG. 4F is a cross-sectional illustration of the structure of FIG. 4E following the process to pattern the electrode material form an electrode and the formation of a dielectric adjacent to electrode.

FIG. 4F is a cross-sectional illustration of the structure of FIG. 4E following the process to pattern the electrode 304 and the formation of a dielectric 424 adjacent to electrode 304. In an embodiment, a mask 426 is formed on the dielectric 410. The mask 426 may include a photo resist material or a layer of dielectric that has been patterned into the mask 426. In an exemplary embodiment, mask 426 includes a dielectric layer that has been patterned to form mask 426. The mask 426 extends over the electrode 304 and 302 and includes an opening for where a contact for electrode 302 may be located.

In an embodiment, a plasma etch process is utilized to etch an opening 428. In the illustrative embodiment, the plasma etch process etches portions of the dielectric layer 410, the ferroelectric layer 422 and the electrode 304 to form an opening 428. The plasma etch may or may not remove the dielectric layer 406. After formation of the opening 428 the dielectric 424 is blanket deposited into the opening 428, on the dielectric layer 406, on sidewalls of the electrode 304, on sides of ferroelectric layer 422 in the opening 428 and adjacent to and on a top surface of the mask 426. The dielectric 424 may be planarized after deposition. It may be advantageous for the dielectric 424 to include a same or substantially the same material as the material of the mask 426, for example, a silicon oxide, or a silicon oxy nitride. After deposition an uppermost portion of the mask 426 and the dielectric 424 are planarized. As shown, uppermost surfaces dielectric 424A and mask 426A are co-planar or substantially coplanar after the planarization process. In an embodiment, the dielectric 424 is formed a distance, $S_1$, away from an exterior sidewall of columnar electrode 420A. The distance, $S_1$, is sufficiently large enough to accommodate a second contact to be formed between the dielectric 424 and the columnar electrode 420A.

Figure 4G:
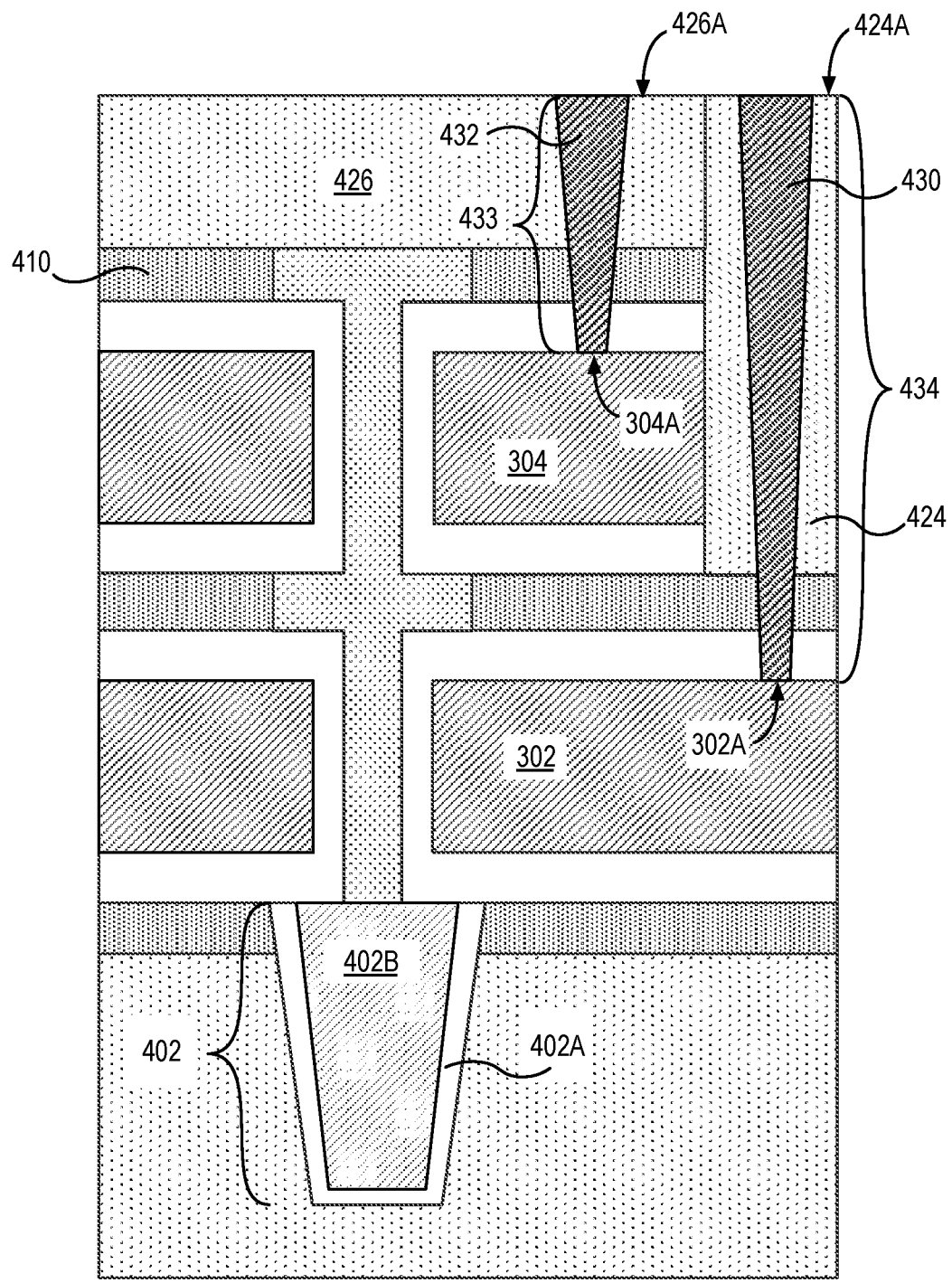
FIG. 4G is a cross-sectional illustration of the structure of FIG. 4E following the process to form a plurality of contacts.

FIG. 4G is a cross-sectional illustration of the structure of FIG. 4F following the process to form a contact 430 on the electrode 302 and a contact 432 on the electrode 304. In an embodiment, openings 433 and 434 are simultaneously formed in the mask 426 and in the dielectric 424, respectively. The plasma etch is utilized to etch the dielectric 424 and the dielectric 406 below the dielectric 424, and the material of the mask 426 and the dielectric 410 below the mask 426. The plasma etch process exposes uppermost surfaces of the electrodes 304 and 302.

In an embodiment, a material for contact electrodes is deposited in each of the openings 433 and 434 on the uppermost surfaces 302A, 304A and on an uppermost surface of the mask. In an embodiment, the material for contact electrodes includes a material that is the same or substantially the same as the material of the contact 226 described in association with FIG. 2H. After the material for contact electrodes is deposited, a planarization process may be carried out to form the contacts 430 and 432 by removing any excess material for contact electrodes from the uppermost surfaces 424A and 426A.

As discussed above, total capacitance may be greater in integrated capacitor structure 300 compared to integrated capacitor structure 100B. The total capacitance may be increased further in integrated capacitor structure 300 by increasing a height of the columnar electrode 420A and adding more lateral extensions above lateral extension 420C.

In other embodiments, the total capacitance may be increased by increasing a number of lateral extensions within any external non shared electrode such as electrode 302 or 304 depicted in FIG. 4G.

Figure 5:
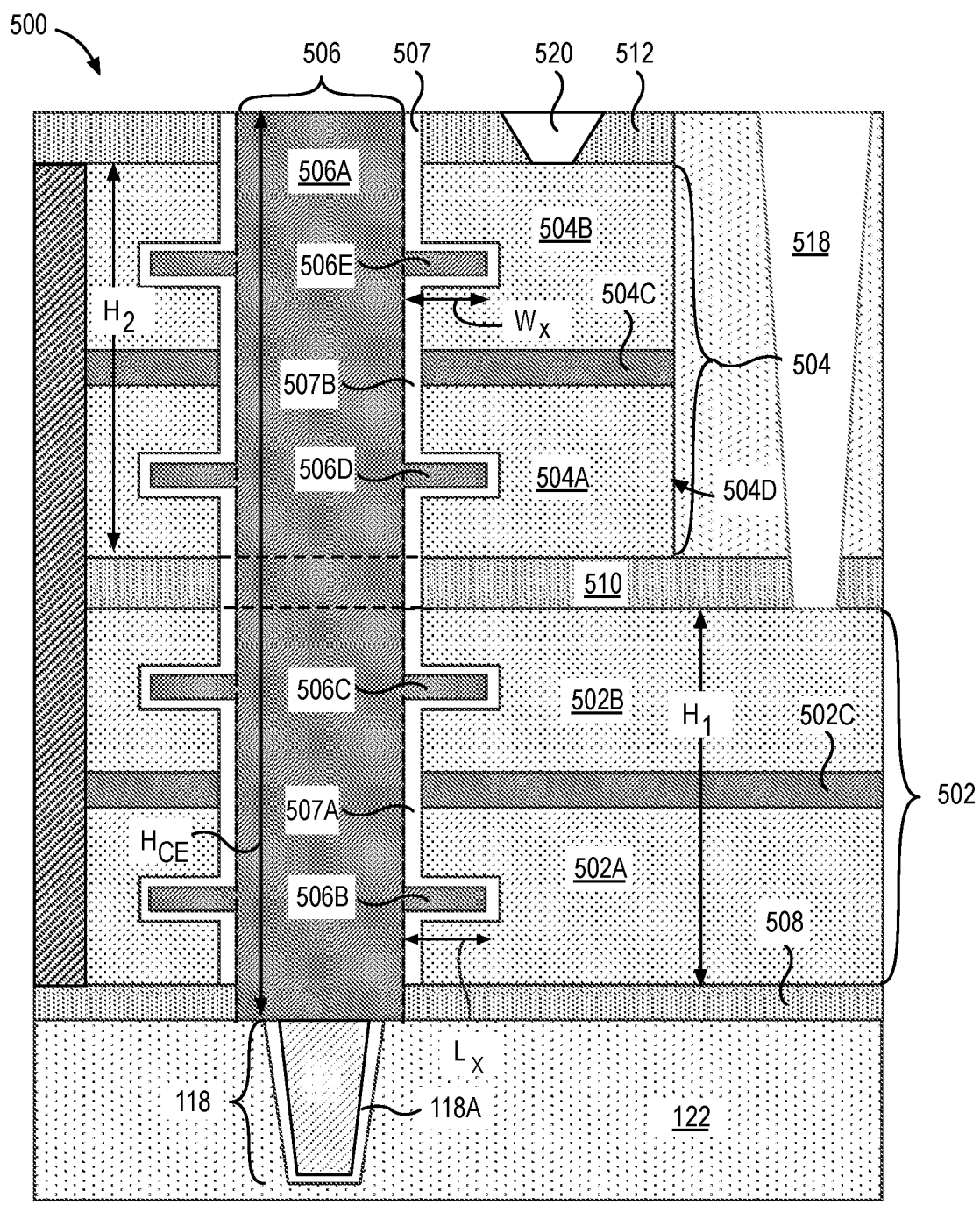
FIG. 5 is a cross-sectional illustration of an integrated capacitor structure, in accordance with an embodiment of the present disclosure.

FIG. 5 is a cross-sectional illustration of an integrated capacitor structure 500, in accordance with an embodiment of the present disclosure. The integrated circuit capacitor structure 500 includes a first electrode 502 comprising a first metal feature below a second electrode 504 comprising a second metal feature. The integrated circuit capacitor structure further includes a third electrode 506 including a columnar electrode 506A through the electrode 502 and the electrode 504. The integrated capacitor structure 500 further includes a ferroelectric layer 507, between the electrode 502 and electrode 506 and between electrode 504 and electrode 506, as shown.

In the illustrative embodiment, the ferroelectric layer 507 is on an exterior sidewall of the electrode 506 extending from a base portion to a top end of the electrode 506. However, the ferroelectric layer 507 has a longer path length from the base portion to the top surface compared to a height of the electrode 506. The path length of the ferroelectric layer 507 is longer because of a presence of a plurality of lateral extensions along the height, $H_{CE}$, of the electrode 506.

As shown, the electrode 506 includes a first of a plurality of lateral extensions 506B ((herein lateral extension 506B), a second of a plurality of lateral extensions 506C (herein lateral extension 506C), a third of a plurality of lateral extensions 506D (herein lateral extension 506D), and a fourth of a plurality of lateral extensions 506E (herein lateral extension 506E), that are vertically spaced apart along a height, $H_{CE}$, of the columnar electrode 506A. In the illustrative embodiment, lateral extension 506C is on a horizontal plane between lateral extension 506B and lateral extension 506D, and lateral extension 506D is on a horizontal plane between lateral extension 506C and lateral extension 506E.

In the illustrative embodiment, the electrode 502 is adjacent to the columnar electrode 506A between lateral extension 506B and dielectric layer 508. The electrode 502 is also adjacent to the columnar electrode 506A between lateral extension 506B and lateral extension 506C. The electrode 502 and the electrode 504 are separated by a dielectric layer 510. In an embodiment, electrode 502 and 504 are vertically separated by at least 5 nm.

The electrode 502 is also adjacent to the columnar electrode 506A between lateral extension 506C and dielectric layer 510, as shown.

In the illustrative embodiment, electrode 504 is adjacent to the columnar electrode 506A between lateral extension 506D and dielectric layer 510. The electrode 504 is also adjacent to the columnar electrode 506A between lateral extension 506D and lateral extension 506E. The electrode 504 is also adjacent to the columnar electrode 506A between lateral extension 506E and a dielectric layer 512, as shown.

As shown, the ferroelectric layer 507 has a portion 507A sandwiched between electrode 506 and electrode 502 that extends between the dielectric layer 508 and dielectric layer 510, and a portion 507B sandwiched between electrode 506 and electrode 504 that extends between an uppermost surface of dielectric layer 510 and dielectric layer 512. The portions 507A and 507B correspond to two memory storage bits (ferroelectric capacitors) of integrated capacitor structure 500.

Extra capacitance in integrated capacitor structure 500 is available through the extra coverage of the ferroelectric layer 507 on the lateral extensions 506B, 506C, 506D and 506E. In the illustrative embodiment, each of the lateral extensions 506B, 506C, 506D and 506E have a lateral width, $W_X$. The coverage of the ferroelectric layer portion 507A is increased by two times the lateral width, $W_X$ for each lateral extension 506B and 506C. There may not be any extra capacitance available through a finite thickness of the lateral extensions 506B and 506C. Thus, increasing lateral extensions can offer an advantageous pathway for increasing total bit capacitance. Similarly, the coverage of the ferroelectric layer portion 507B is increased by two times the lateral width, $W_X$ for each lateral extension 506D and 506E. There may not be any extra capacitance available through a finite thickness of the lateral extensions 506D and 506E. The columnar electrode portion 506A includes portions where integrated capacitor structure 500 does not provide any additional capacitance, such as portions that are directly adjacent to the dielectric layer 508, 510 and 512.

In the illustrative embodiment, each electrode 502 and 504 further includes a lateral conductive layer that is indicative of one or more process methodology utilized to fabricate integrated capacitor structure 500. As shown electrode 502 includes an electrode layer 502A that surrounds the lateral extension 506B, and a portion 502B above the portion 502A that surrounds the lateral portion 506C. The electrode 504 further includes a lateral conductive layer 502C between the portion 502A and portion 502B. Also as shown, lateral conductive layer 502C extends horizontally between lateral extensions 506B and 506C.

As shown electrode 504 includes an electrode layer portion 504A that surrounds the lateral extension 506D, and a portion 504B above the portion 504A that surrounds the lateral portion 506E. The electrode 504 further includes a lateral conductive layer 504C between the portion 504A and portion 504B. Also as shown, lateral conductive layer 504C extends horizontally between lateral extensions 506D and 506E.

In exemplary embodiments, conductive layer 502C and 504C each include a material that is the same or substantially the same as the material of the electrode 502 or 504.

In the illustrative embodiment, the electrode 502 has a vertical thickness, $H_1$ as measured from a lowermost electrode surface. In the illustrative embodiment, the electrode 504 has a vertical thickness, $H_2$ as measured from a lowermost electrode surface. In embodiments $H_1$ and $H_2$ are between 50 nm and 300 nm.

In the illustrative embodiment, to facilitate contact with terminals, the electrodes 502 and 504 have a staircase shape. As shown, the electrode 502 extends laterally beyond a sidewall 504D of the electrode 504. A first contact 518 is on coupled with the electrode 502 and a second contact 520 is coupled with the electrode 504. In the illustrative embodiment, contact 520 is laterally between electrode 502 and the contact 518.

The electrode 502 is further coupled with a conductive interconnect 118. The conductive interconnect 118 may be coupled with a transistor (not shown). As shown, dielectric 122 is adjacent to the conductive interconnect 118 and a dielectric 508 is between the outer electrode 502 and dielectric 122.

In embodiments, the electrode 502 and electrode 504 include titanium, tantalum, tungsten, ruthenium, or nitrides of titanium, tantalum, tungsten, ruthenium.

In embodiments, electrode 506 includes titanium, tantalum, tungsten, ruthenium, copper, or nitrides of titanium, tantalum, tungsten, ruthenium. In some embodiments, electrodes 302, 304 and 306 include a same material.

In embodiments, dielectric layer 508, 510 and 512 include silicon and one or more of nitrogen and carbon such as, silicon nitride, carbon doped silicon nitride or silicon carbide.

In embodiments, dielectric layers 122 includes silicon and one or more of nitrogen, oxygen and carbon such as, silicon nitride, silicon dioxide, carbon doped silicon nitride, silicon oxynitride or silicon carbide.

In embodiments contacts 518 and 520 include titanium, tantalum, tungsten, ruthenium, copper, or nitrides of titanium, tantalum, tungsten, ruthenium. In other embodiments the contacts 518 and 520 include a liner layer including ruthenium or tantalum and a fill metal such as copper or tungsten.

FIGS. 6A-6H illustrate numerous operations to fabricate the integrated circuit capacitor structure 500, in accordance with an embodiment of the present disclosure.

Figure 6A:
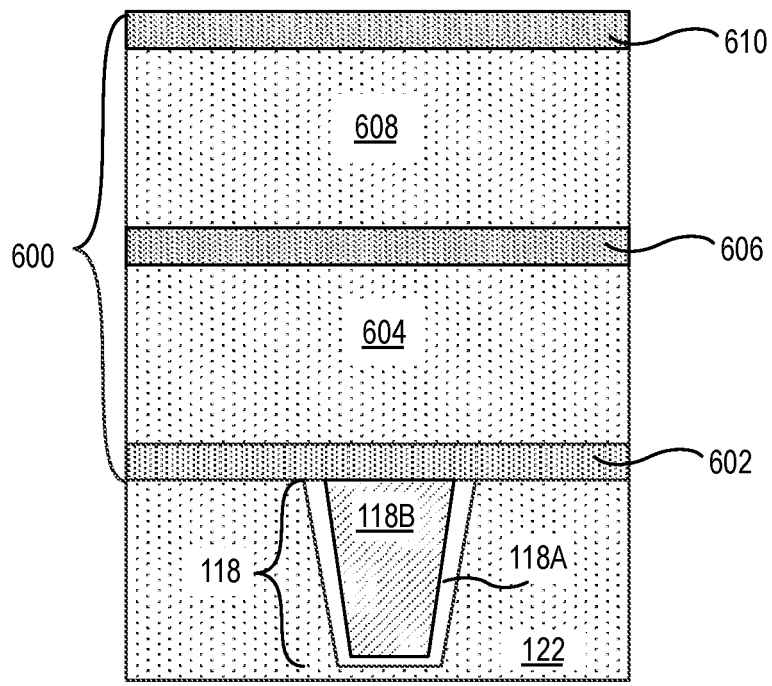
FIG. 6A illustrates a material layer stack formed above a conductive interconnect.

FIG. 6A illustrates a material layer stack 600 formed above a conductive interconnect 118. In the illustrative embodiment, forming the material layer stack 600 includes depositing a dielectric layer 602 on the conductive interconnect 118, and on the dielectric 122. In an embodiment, the dielectric layer 602 includes a material that is the same or substantially the same as the material of the dielectric 404. In one or more embodiments, dielectric layer 602 is formed by a process that is the same or substantially the same as the process utilized to deposit dielectric 404.

A electrode layer 604 is blanket deposited on the dielectric layer 602. The electrode layer 604 includes a material that is the same or substantially the same as the material of the electrode 502. The electrode layer 604 may be blanket deposited using a PVD, or a CVD process to a thickness between 50 nm and 300 nm.

A dielectric layer 606 is blanket deposited on the electrode layer 604. In embodiments, dielectric layer 606 includes a material that is the same or substantially the same as the material of the dielectric 602. In other embodiments, dielectric layer 606 is a material that has a different material composition from dielectric layer 602 or 610. For example, dielectric layer 602 and 610 may include silicon and oxygen with carbon doping, or silicon, oxygen and nitrogen, vor silicon, oxygen, nitrogen and carbon, whereas dielectric layer 606 may include silicon and oxygen. In an embodiment, dielectric layer 606 is deposited in the same manner as dielectric layer 602. Dielectric is deposited to a thickness that determines a spatial separation between electrode 502 and 504 depicted in FIG. 5.

Referring again to FIG. 6A, a metal electrode layer 608 is blanket deposited on the dielectric layer 606. The electrode layer 608 includes a material that is the same or substantially the same as the material of the electrode 502 of electrode 504 described in association with FIG. 5. The electrode layer 608 may be blanket deposited using a PVD, or a CVD process to a thickness between 50 nm and 300 nm.

A dielectric layer 610 is blanket deposited on the electrode layer 608. In embodiments, dielectric layer 610 includes a material that is the same or substantially the same as the material of the dielectric 602. In an embodiment, dielectric layer 610 is deposited in the same manner as dielectric layer 610. The dielectric layer 610 may be deposited to a thickness that is sufficient to provide a planarization stop surface, such as a thickness between 5 nm and 100 nm.

Figure 6B:
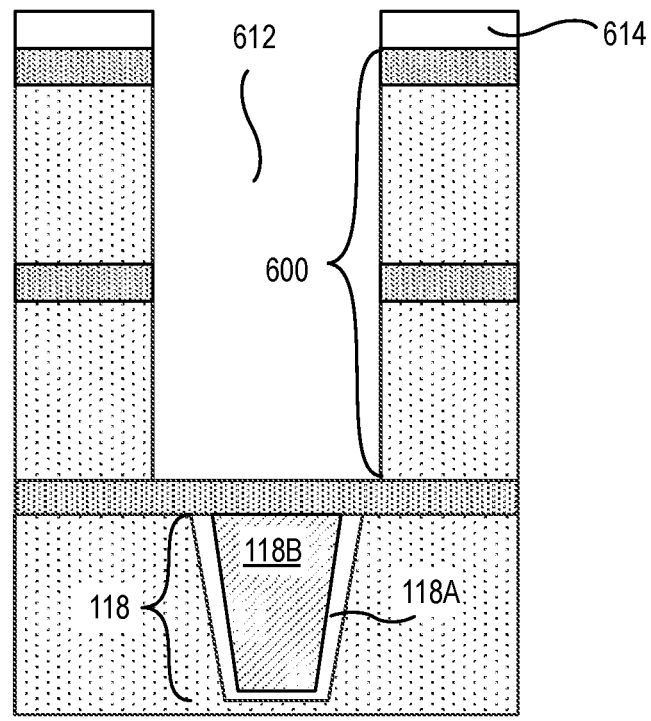
FIG. 6B is a cross-sectional illustration of the structure of FIG. 6A following the formation of an opening in the material layer stack.

FIG. 6B is a cross-sectional illustration of the structure of FIG. 6A following the formation of an opening 612 in the material layer stack 600. In an embodiment, a mask 614 is formed on the dielectric layer 610. The mask 614 defines locations for a central electrode to be formed. In an embodiment, a plasma etch process is utilized to sequentially etch the dielectric layer 610, the metal electrode layer 608, the dielectric layer 606 and the metal electrode layer 604. The plasma etch is halted after exposure of the dielectric layer 602 so that the conductive interconnect 118 is not exposed. The mask 614 may be removed after the etch process.

Figure 6C:
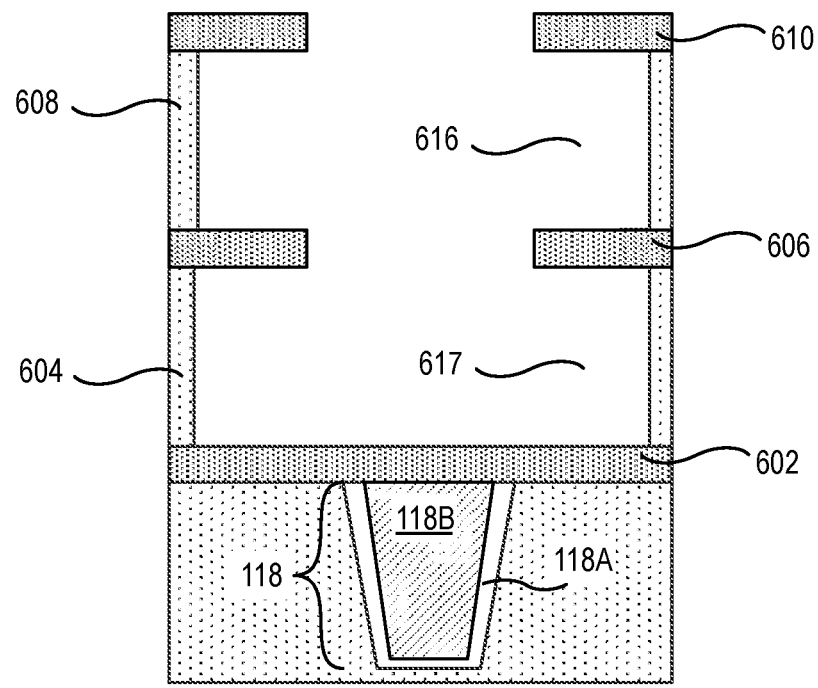
FIG. 6C is a cross-sectional illustration of the structure of FIG. 6B following the process to laterally recess electrode layers in the material layer stack.

FIG. 6C is a cross-sectional illustration of the structure of FIG. 6B following the process to laterally recess the electrode layers 604 and 608. In an embodiment, the lateral recess is performed by a wet chemical etch, a plasma etch or a combination thereof.

In the illustrative embodiment, the electrode layers 604 and 608 are laterally recessed under the dielectric layers 610 and 606. The process forms recesses 616 and 617, as shown.

Figure 6D:
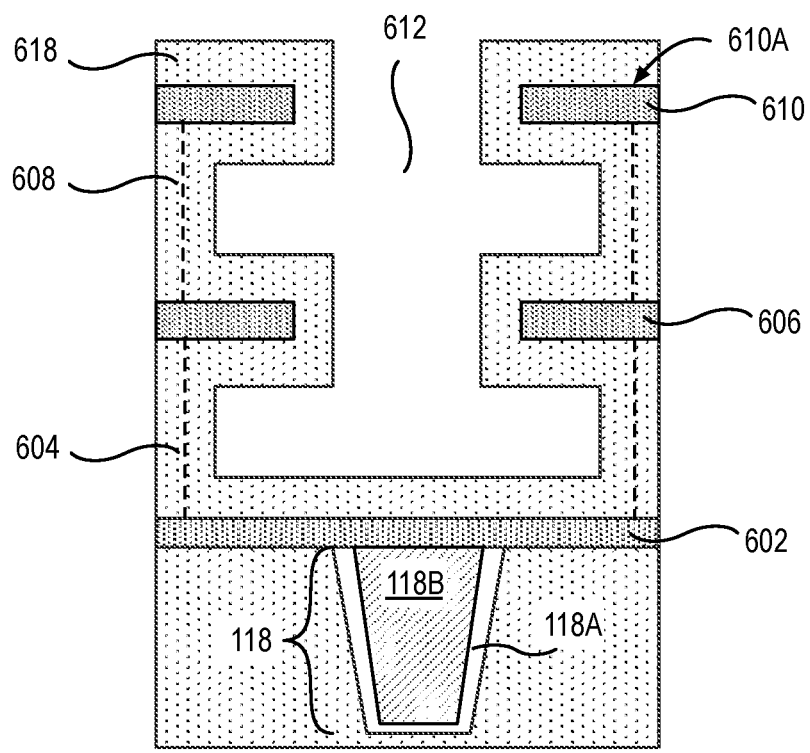
FIG. 6D is a cross-sectional illustration of the structure of FIG. 6C following the process to deposit an electrode layer on exposed surfaces of dielectric layers and on recessed portions of electrode layers in the material layer stack.

FIG. 6D is a cross-sectional illustration of the structure of FIG. 6C following the process to deposit an electrode layer 618 on exposed surfaces of the dielectric layers 610, 606 and 602 and on recessed portions of the electrode layers 608 and 610.

In an embodiment, an electrode layer 618 is deposited using an ALD process. The ALD process may advantageously form a conformal electrode layer 618 directly adjacent to the electrode layers 608 and 610, in the recesses 616 and 617. In the illustrative embodiment, the ALD process also deposits the electrode layer 618 on top and bottom surfaces of the dielectric 610, and 608 and on sidewall portions of dielectric layers 610, 606, as shown. In an embodiment, the electrode layer 618 includes a material that is the same or substantially the same as the material of the electrode layer 608 or 604. In an embodiment, the electrode layer is deposited to a thickness that is between 10 nm and 100 nm.

Figure 6E:
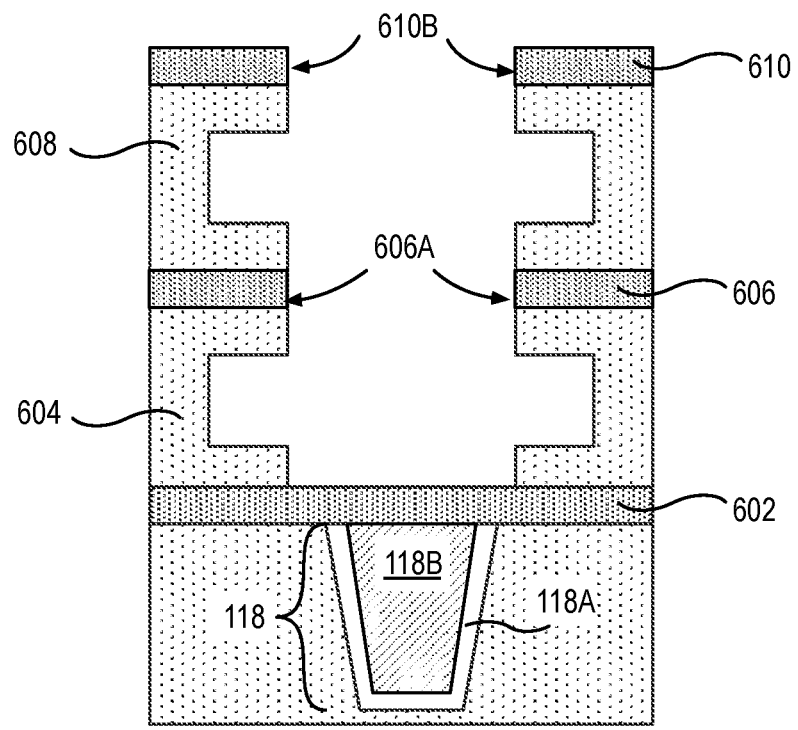
FIG. 6E is a cross-sectional illustration of the structure of FIG. 6D following the process to etch portions of the electrode layer.

FIG. 6E is a cross-sectional illustration of the structure of FIG. 6D following the process to etch portions of the electrode layer 618. Depending on embodiments, a plasma etch, wet chemical etch, or a combination thereof is utilized to etch the electrode layer 618. In an embodiment, the plasma etch process etches the electrode layer 618 off the sidewalls 610B and 606A. Portion of the electrode layer 618 is also etched and removed from a top surface 602A, as shown.

It is to be appreciated that the process of removing the electrode material from sidewall 606A of dielectric layer 606 is important to prevent shorting between lateral electrodes, that will be formed. (such as electrodes 502 and 504).

Figure 6F:
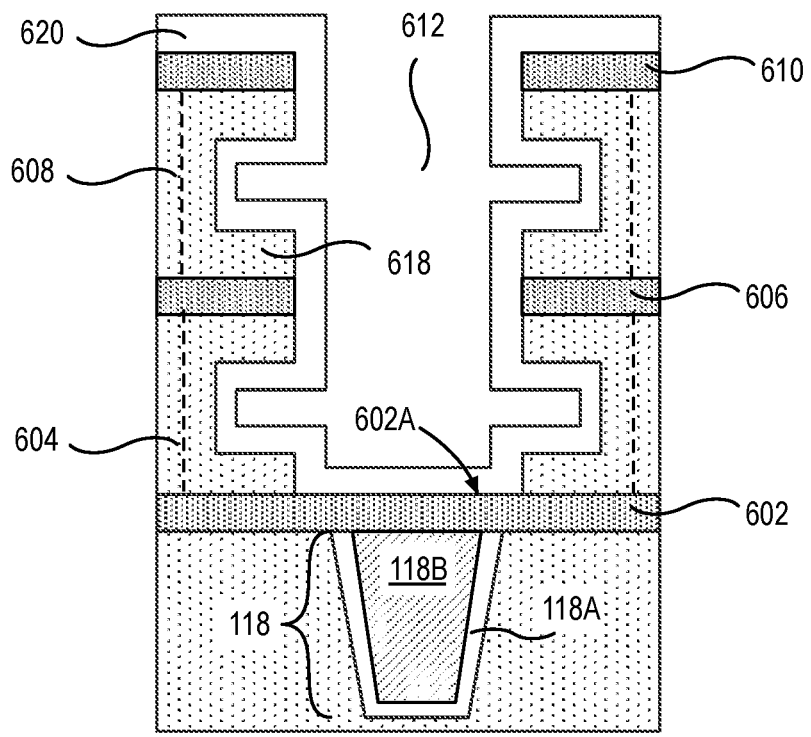
FIG. 6F is a cross-sectional illustration of the structure of FIG. 6G following the formation of a ferroelectric layer in the opening.
Figure 6G:
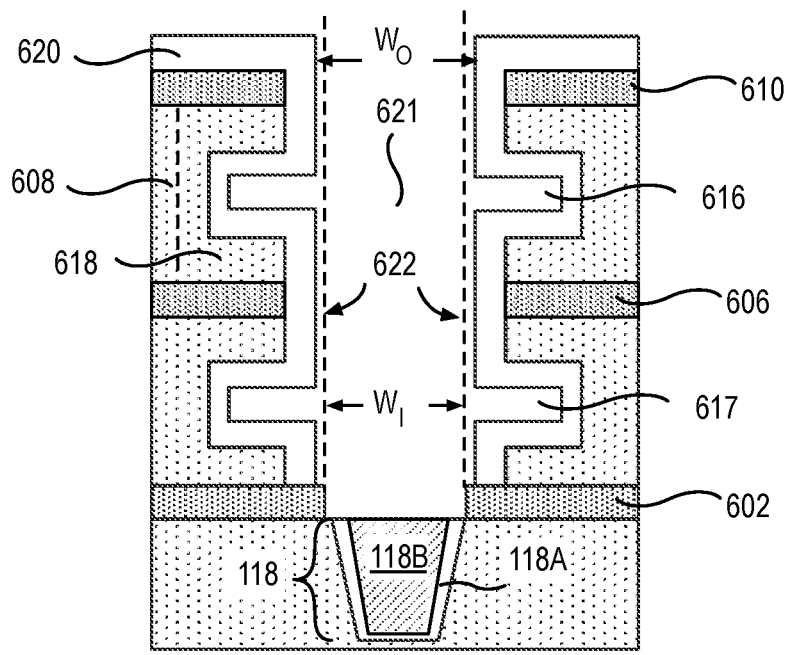
FIG. 6G is a cross-sectional illustration of the structure of FIG. 6F following the process to etch portions of the ferroelectric layer.

FIG. 6F is a cross-sectional illustration of the structure of FIG. 6G following the formation of a ferroelectric layer 620 in the opening 612. In an embodiment, the ferroelectric layer 620 is blanket deposited on a top surface 602A of the dielectric layer 602. On sidewalls of the dielectric layer 610, on sidewalls of the electrode layer 608, sidewalls of the dielectric layer 606, on electrode layer 618 and on a top surface of dielectric layer 610. In an embodiment, the ferroelectric layer 620 includes a material that is the same or substantially the same as the material of the ferroelectric layer 507. The ferroelectric layer 620 is deposited to a thickness of 2 nm to 20 nm. In an embodiment, a physical vapor deposition process is utilized to blanket deposit ferroelectric layer 620. In an embodiment, an atomic layer deposition (ALD) process may be utilized to deposit the ferroelectric layer 620. An ALD process may conformally deposit the ferroelectric layer 620 on the sidewalls of the electrode layer 618.

FIG. 6G is a cross-sectional illustration of the structure of FIG. 6F following the process to etch portions of the ferroelectric layer 620. In an embodiment, a sacrificial fill material is deposited in the opening 612, in the recesses 616 and 617 and is etched. In an embodiment, after an etch process, the sacrificial fill material is removed from the opening 621 but remains in the recesses 616 and 617 as indicated by dashed lines 622. It is to be appreciated that in some embodiments, opening 621 has a lateral width, $W_f$, that is less than a spacing between the ferroelectric layer 620 on sidewalls of dielectric layer 610, 606 and 602. In an embodiment, a plasma etch process is utilized to etch the ferroelectric layer 620 from above the dielectric 602. In an embodiment, the sacrificial fill material protects the ferroelectric layer 620 deposited adjacent to the electrode layer 618 during the etch process. After etching the ferroelectric layer 620, the dielectric layer 602 is exposed and etched. The conductive interconnect 118 is exposed after a process to etch the dielectric layer 602. In some embodiments, an opening formed in the dielectric layer 602 is less wide than Wo. In other embodiments, a wet etch process may be utilized to etch dielectric layer 602. After exposing the conductive interconnect 118 the sacrificial material may be removed.

In other embodiments, not shown, a metal liner may be conformally or substantially conformally deposited on the ferroelectric layer 620. In an embodiment, portions of the metal liner may be etched off after deposition by an anisotrpic plasma etch process. The plasma etch process may remove portions of the metal liner above the conductive interconnect 118 faster than portions of the metal liner adjacent to ferroelectric layer 620 that is on sidewalls of the dielectric 606. After removing the metal liner from above the conductive interconnect 118, the ferroelectric layer 620 and dielectric layer 602 above the conductive interconnect 118 may be etched to expose the conductive interconnect 118. Unetched portions of the metal liners may stay adjacent to the ferroelectric layer 620. Such a process may be utilized to protect vertical portions of the ferroelectric layer 620.

Figure 6H:
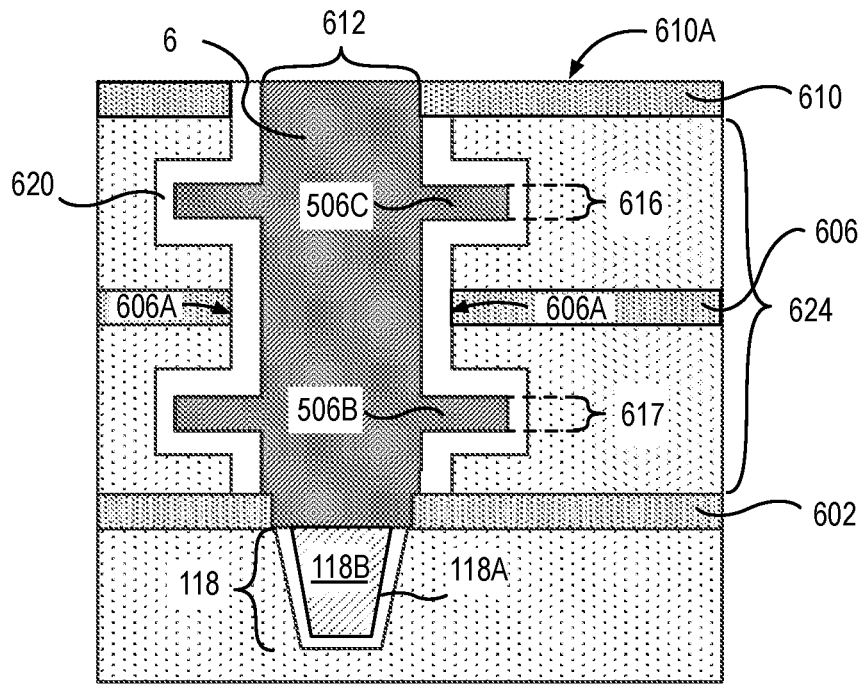
FIG. 6H is a cross-sectional illustration of the structure of FIG. 6G following the formation of an electrode in the opening.

FIG. 6H is a cross-sectional illustration of the structure of FIG. 6G following the formation of electrode 506 in the opening 612. In an embodiment, an electrode material is deposited into the opening on the ferroelectric layer 620 and on a top surface 610A. The electrode material fills the recesses 616 and 617, as shown. In an embodiment, the recess 616 and 617 formed may be backfilled with a material of the electrode 618, 608, 604 or one or more materials of the conductive interconnect 118. In an embodiment, a planarization process is performed to remove excess electrode material from above the surface 610A.

In an embodiment, a CMP process may be utilized to planarize and remove excess electrode material and ferrolelectric layer 620 from above the dielectric layer 610. The planarization process forms an electrode structure 622 having a central vertical portion 622A and above conductive interconnect 118A (for example between sidewalls 606A). The process to fill the recesses 617 and 618 forms lateral extensions 622B and 622C.

In embodiments, after formation of electrode 622, dielectric layer 606 is removed selectively to the dielectric layer 602 and 610. The dielectric layer 606 may be removed by a wet chemical etch forming a recess. In an embodiment, the recess formed is backfilled with a material of the electrode 618, 608 or 604. Thus, a single programmable cell with electrode 622 and outer electrode 624 may be fabricated by the process operations described herein. As shown, electrode structure 622 is the same or substantially the same as electrode structure 506 having a central column 506A and lateral extensions 506B and 506C (described in FIG. 5), and outer electrode 624 is the same or substantially the same as electrode 502 (described in FIG. 5) after removal of the dielectric layer 606 and deposition of an electrode material in place of dielectric layer 606.

By fabricating a material layer stack 600 having more layers of dielectric such as dielectric layer 610 and dielectric layer 604 (not shown) two or more electrodes above electrode 618 can be fabricated.

In an embodiment, contacts may be formed on the structure of FIG. 6H by utilizing one or more of the process operations described above.

Figure 7:
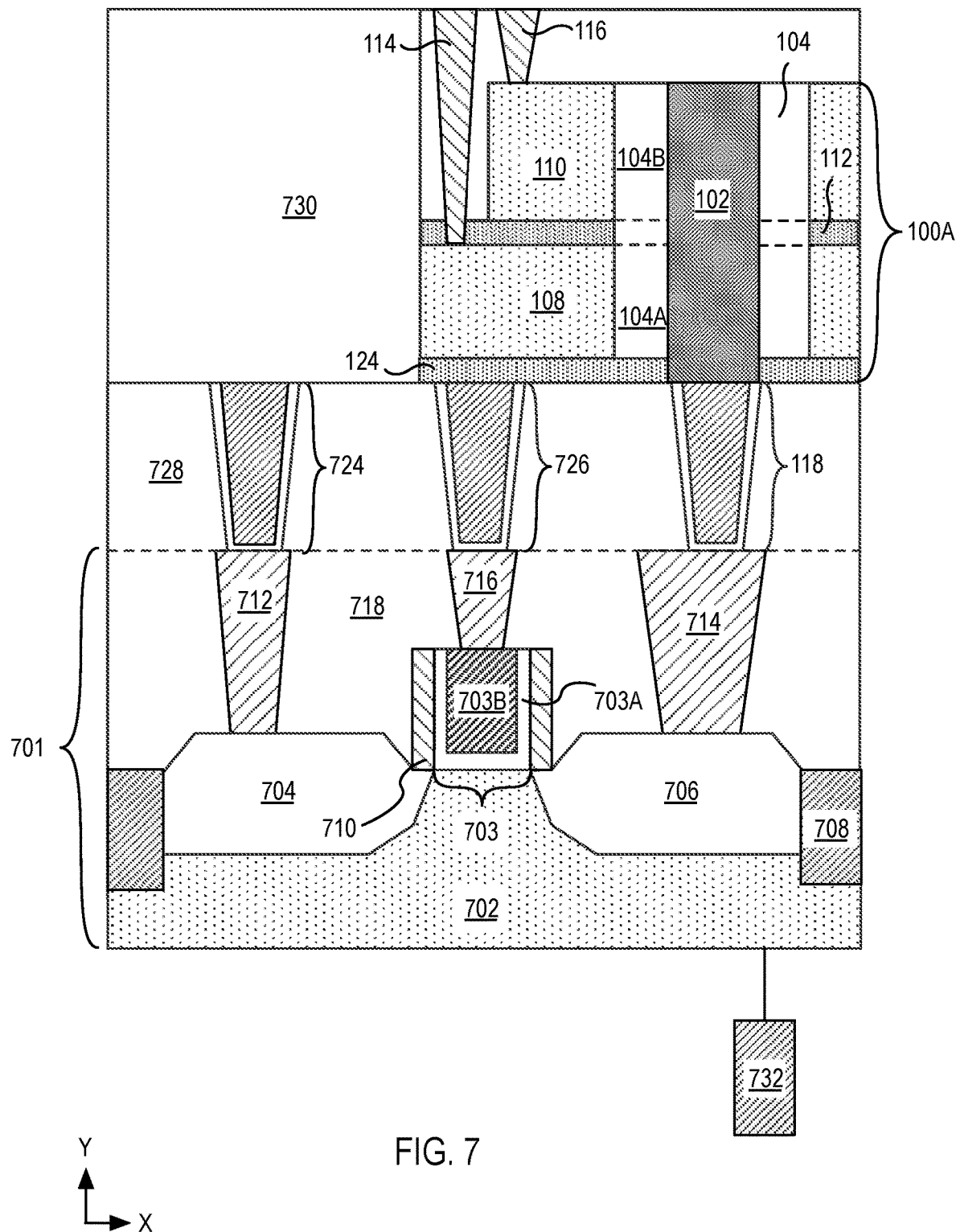
FIG. 7 illustrates a system which includes a capacitor coupled to an access transistor.

FIG. 7 illustrates a system 700 which includes a capacitor such as capacitor 100A, 100B, 300 or 500 described in association with FIG. 1A, 1D, 3 or 5, respectively, coupled to an access transistor 701. Referring again to FIG. 7, in an embodiment, the transistor 701 is on a substrate 702 and has a gate 703, a source region 704, and a drain region 706. In the illustrative embodiment, an isolation 708 is adjacent to the source region 704, drain region 706 and portions of the substrate 702. In some implementations of the disclosure, such as is shown, a pair of sidewall spacers 710 are on opposing sides of the gate 703.

The transistor 701 further includes a source contact 712 above and electrically coupled to the source region 704, drain contact 714 above and electrically coupled to the drain region 706 and a gate contact 716 above and electrically coupled to the gate 703, as illustrated. The transistor 701 also includes dielectric 718 adjacent to the gate 703, source region 704, drain region 706, isolation 708, sidewall spacers 710, source contact 712, drain contact 714 and gate contact 716.

The gate contact 716 and source contact 712 are each coupled with interconnects. In the illustrative embodiment, gate contact 716 is coupled with a gate interconnect 724 and the source contact 712 is coupled with a source interconnect 726. The dielectric 728 is adjacent to source interconnect 726 and gate interconnect 724. In an embodiment, the system 700 further includes a battery and antenna inside unit 732 coupled to the transistor 701.

In the illustrative embodiment, the integrated circuit capacitor structure 100A includes an electrode 102 comprising a cylindrical column, a ferroelectric layer 104 around an exterior sidewall of the electrode 102. The capacitor structure 100A further includes an outer electrode 108 that is laterally adjacent to a first portion 104A of an exterior of the ferroelectric layer 104 and an outer electrode 110 that is laterally adjacent to a second portion 104B of the exterior of the ferroelectric layer 104. In one embodiment, the second outer electrode 110 is above the first outer electrode 108, as shown. In the illustrative embodiment, the ferroelectric layer has a ferroelectric layer portion 104A adjacent to outer electrode 108 and a ferroelectric layer portion 104B adjacent to the outer electrode 110. The ferroelectric layer portions 104A and 104B can be programmed independently of each other. The integrated circuit capacitor structure 100A is adjacent to a region 730 above transistor 701. In some embodiments, transistor 701 includes peripheral integrated circuit structure elements, not shown.

The electrode 102 is further coupled with the transistor 701 through the conductive interconnect 118. As shown the conductive interconnect 118 is on and coupled with the drain contact 714 of the transistor 701. As shown, dielectric 124 is between the outer electrode 108 and dielectric 728. In the illustrative embodiment, dielectric 124 is also laterally adjacent to the electrode 102 and directly below and in contact with ferroelectric layer 104. The dielectric 124 may facilitate as an etch stop layer as well as a copper diffusion barrier layer.

In an embodiment, the underlying substrate 702 represents a surface used to manufacture integrated circuits. Suitable substrate 702 includes a material such as single crystal silicon, polycrystalline silicon and silicon on insulator (SOI), as well as substrates formed of other semiconductor materials. In some embodiments, the substrate 702 may also include semiconductor materials, metals, dielectrics, dopants, and other materials commonly found in semiconductor substrates.

In an embodiment, the transistor 701 associated with substrate 702 are metal-oxide-semiconductor field-effect transistors (MOSFET or simply MOS transistors), fabricated on the substrate 702. In some embodiments, the transistor 701 is an access transistor 701. In various implementations of the disclosure, the transistor 701 may be planar transistors, nonplanar transistors, or a combination of both. Nonplanar transistors include FinFET transistors such as double-gate transistors and tri-gate transistors.

In some embodiments, gate 703 includes at least two layers, a gate dielectric layer 703A and a gate electrode 703B. The gate dielectric layer 703A may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer 703A to improve its quality when a high-k material is used.

The gate electrode 703B of the access transistor 701 of substrate 702 is formed on the gate dielectric layer 703A and may consist of at least one P-type work function metal or N-type work function metal, depending on whether the transistor is to be a PMOS or an NMOS transistor. In some implementations, the gate electrode 703B may consist of a stack of two or more metal layers, where one or more metal layers are work function metal layers and at least one metal layer is a conductive fill layer.

For a PMOS transistor, metals that may be used for the gate electrode 703B include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.6 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.6 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode 703B may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode 703B may consist of one or more U-shaped metal layers formed atop one or more planar, non-U-shaped layers.

The sidewall spacers 710 may be formed from a material such as silicon nitride, silicon oxide, silicon carbide, silicon nitride doped with carbon, and silicon oxynitride. Processes for forming sidewall spacers include deposition and etching process operations. In an alternate implementation, a plurality of spacer pairs may be used, for instance, two pairs, three pairs, or four pairs of sidewall spacers may be formed on opposing sides of the gate stack. As shown, the source region 704 and drain region 706 are formed within the substrate adjacent to the gate stack of each MOS transistor. The source region 704 and drain region 706 are generally formed using either an implantation/diffusion process or an etching/deposition process. In the former process, dopants such as boron, aluminum, antimony, phosphorous, or arsenic may be ion-implanted into the substrate to form the source region 704 and drain region 706. An annealing process that activates the dopants and causes them to diffuse further into the substrate typically follows the ion implantation process. In the latter process, the substrate 702 may first be etched to form recesses at the locations of the source and drain regions. An epitaxial deposition process may then be carried out to fill the recesses with material that is used to fabricate the source region 704 and drain region 706. In some implementations, the source region 704 and drain region 706 may be fabricated using a silicon alloy such as silicon germanium or silicon carbide. In some implementations, the epitaxially deposited silicon alloy may be doped in situ with dopants such as boron, arsenic, or phosphorous. In further embodiments, the source region 704 and drain region 706 may be formed using one or more alternate semiconductor materials such as germanium or a group III-V material or alloy. And in further embodiments, one or more layers of metal and/or metal alloys may be used to form the source region 704 and drain region 706.

In an embodiment, the source contact 712, the drain contact 714 and gate contact 716 each include liner layer and a fill metal on the liner layer. In an embodiment, the liner layer includes one or more of Ti, Ru or Al and the fill metal includes W or Ni.

In an embodiment, the source interconnect 726, gate interconnect 724, each include a liner layer and a fill metal on the liner layer, as shown. In an embodiment, the liner layer includes one or more of Ti, Ta, Ru or Al. The fill metal may include a material such as W or Cu.

The isolation 708 and dielectric 718 and 728 may each include any material that has sufficient dielectric strength to provide electrical isolation. Materials may include silicon and one or more of oxygen, nitrogen or carbon such as silicon dioxide, silicon nitride, silicon oxynitride, carbon doped nitride or carbon doped oxide.

Figure 8:
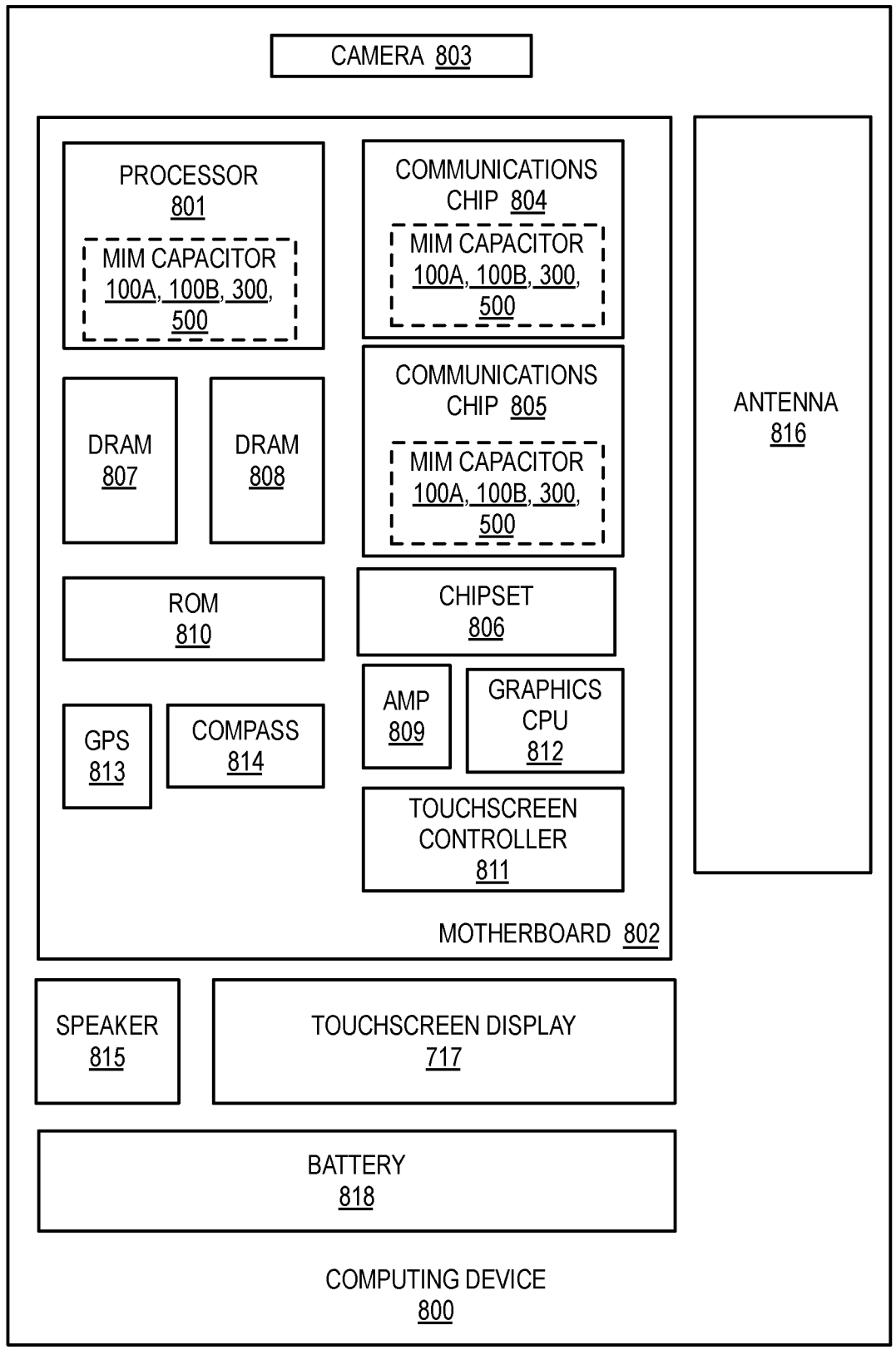
FIG. 8 illustrates a computing device in accordance with embodiments of the present disclosure.

FIG. 8 illustrates a computing device 800 in accordance with embodiments of the present disclosure. As shown, computing device 800 houses a motherboard 802. Motherboard 802 may include a number of components, including but not limited to a processor 801 and at least one communications chip 804 or 805. Processor 801 is physically and electrically coupled to the motherboard 802. In some implementations, communications chip 805 is also physically and electrically coupled to motherboard 802. In further implementations, communications chip 805 is part of processor 801.

Depending on its applications, computing device 800 may include other components that may or may not be physically and electrically coupled to motherboard 802. These other components include, but are not limited to, volatile memory (e.g., DRAM), non-volatile memory (e.g., ROM), flash memory, a graphics processor, a digital signal processor, a crypto processor, a chipset 806, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 805 enables wireless communications for the transfer of data to and from computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 805 may implement any of a number of wireless standards or protocols, including but not limited to Wi-Fi (IEEE 801.11 family), WiMAX (IEEE 801.11 family), long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 800 may include a plurality of communications chips 804 and 805. For instance, a first communications chip 805 may be dedicated to shorter range wireless communications such as Wi-Fi and Bluetooth and a second communications chip 804 may be dedicated to longer range wireless communications such as GPS, EDGE, GPRS, CDMA, WiMAX, LTE, Ev-DO, and others.

Processor 801 of the computing device 800 includes an integrated circuit die packaged within processor 801. In some embodiments, the integrated circuit die of processor 801 includes one or more interconnect structures, non-volatile memory devices, and transistors coupled with capacitors such as capacitors 100A, 100B, 300 or 500 described in association with FIG. 1A, 1D, 3 or 5, respectively. Referring again to FIG. 8, the term "processor" may refer to any device or portion of a device that processes electronic data from registers and/or memory to transform that electronic data into other electronic data that may be stored in registers and/or memory.

Communications chip 805 also includes an integrated circuit die packaged within communication chip 805. In another embodiment, the integrated circuit die of communications chips 804, 805 includes one or more interconnect structures, non-volatile memory devices, capacitors such as capacitors 100A, 100B, 300 or 500 described above, and transistors coupled with capacitors such as capacitors 100A, 100B, 300 or 500 described above. Depending on its applications, computing device 800 may include other components that may or may not be physically and electrically coupled to motherboard 802. These other components may include, but are not limited to, volatile memory (e.g., DRAM, eDRAM) 807, 808, non-volatile memory (e.g., ROM) 810, a graphics CPU 812, flash memory, global positioning system (GPS) device 813, compass 814, a chipset 806, an antenna 816, a power amplifier 809, a touchscreen controller 811, a touchscreen display 817, a speaker 815, a camera 803, and a battery 818, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 800 and discussed above may contain a stand-alone integrated circuit memory die that includes one or more arrays of nonvolatile memory devices.

In various implementations, the computing device 800 may be a laptop, a netbook, a notebook, an Ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Figure 9:
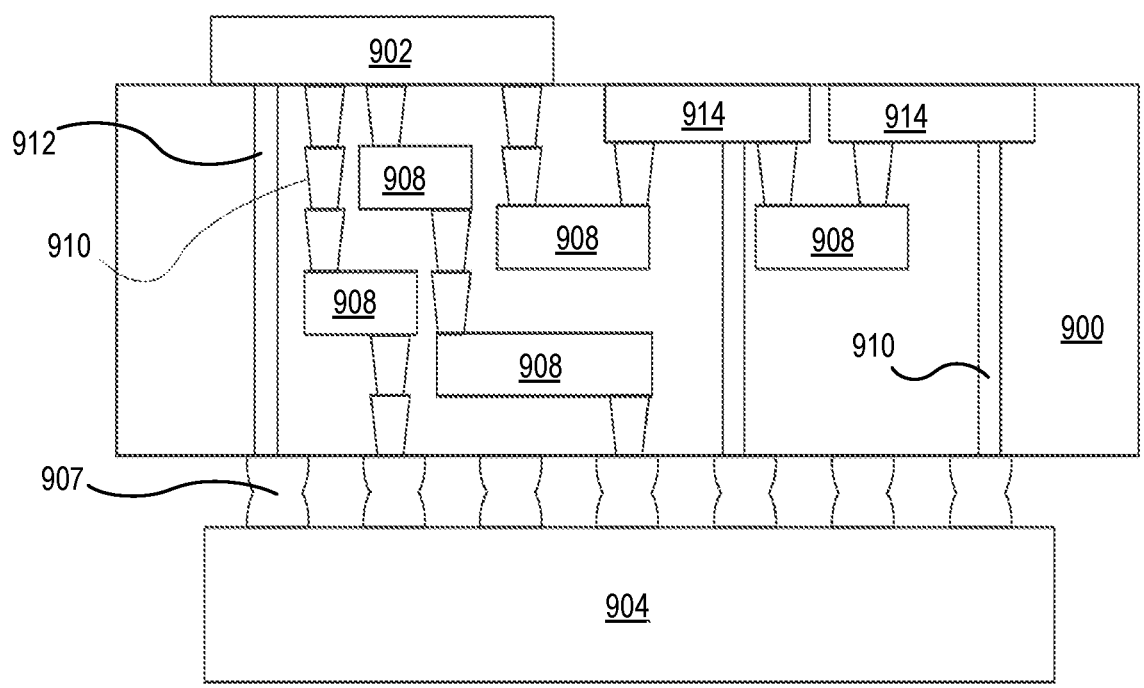
FIG. 9 illustrates an integrated circuit (IC) structure.

FIG. 9 illustrates an integrated circuit (IC) structure 900 that includes one or more embodiments of the disclosure. The integrated circuit (IC) structure 900 is an intervening substrate used to bridge a first substrate 902 to a second substrate 904. The first substrate 902 may be, for instance, an integrated circuit die. The second substrate 904 may be, for instance, a memory module, a computer mother, or another integrated circuit die. Generally, the purpose of an integrated circuit (IC) structure 900 is to spread a connection to a wider pitch or to reroute a connection to a different connection. For example, an integrated circuit (IC) structure 900 may couple an integrated circuit die to a ball grid array (BGA) 907 that can subsequently be coupled to the second substrate 904. In some embodiments, the first substrate 902 and the second substrate 904 are attached to opposing sides of the integrated circuit (IC) structure 900. In other embodiments, the first substrate 902 and the second substrate 904 are attached to the same side of the integrated circuit (IC) structure 900. And in further embodiments, three or more substrates are interconnected by way of the integrated circuit (IC) structure 900.

The integrated circuit (IC) structure 900 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials.

The integrated circuit (IC) structure may include metal interconnects 908 and vias 910, including but not limited to through-silicon vias (TSVs) 912. The integrated circuit (IC) structure 900 may further include embedded devices 914, including both passive and active devices. Such embedded devices 914 include capacitors, decoupling capacitors such as capacitors 100A, 100B, 300 or 500 as described above, resistors, inductors, fuses, diodes, transformers, device structure including transistors, such as transistor 701 coupled with a with one at least capacitor 100A as described in FIG. 7. Referring again to FIG. 9, the integrated circuit (IC) structure 900 may further include embedded devices 914 such as one or more resistive random-access devices, sensors, and electrostatic discharge (ESD) devices. More complex devices such as radiofrequency (RF) devices, power amplifiers, power management devices, antennas, arrays, sensors, and MEMS devices may also be formed on the integrated circuit (IC) structure 900.

Thus, one or more embodiments of the present disclosure relate to capacitor devices such as capacitors 100A, 100B, 300 or 500 as described above. The capacitors 100A, 100B, 300 or 500 may be used in various integrated circuit applications.

In a first example, an integrated circuit capacitor structure, includes a first electrode comprising a cylindrical column, a ferroelectric layer around an exterior sidewall of the cylindrical column and a plurality of outer electrodes. The plurality of outer electrodes include a first outer electrode laterally adjacent to a first portion of an exterior of the ferroelectric layer and a second outer electrode laterally adjacent to a second portion of the exterior of the ferroelectric layer, wherein the second outer electrode is above the first outer electrode.

In second examples, for any of first examples, the ferroelectric layer has a thickness between 2 nm and 20 nm, and where the ferroelectric layer includes oxygen and one or more of Pb, Zr, Hf, Sr, Ba or Ti.

In third examples, for any of the first through second examples, the second outer electrode is vertically spaced apart from the first outer electrode by a distance of at least 5 nm.

In fourth examples, for any of the first through third examples, the integrated circuit capacitor structure further includes a dielectric adjacent to the ferroelectric layer and vertically between the first outer electrode and the second outer electrode.

In fifth examples, for any of the first through fourth examples, the ferroelectric layer around an exterior sidewall of the cylindrical column has a first vertical thickness, where a combined vertical thickness of first outer electrode and the second outer electrode includes a second vertical thickness and where the second vertical thickness is between 90% and 95% of the first vertical thickness.

In sixth examples, for any of the first through fifth examples, the first outer electrode extends laterally beyond the second outer electrode.

In seventh examples, for any of the first through sixth examples, a first contact is coupled with the first outer electrode and a second contact is coupled with the second outer electrode and where the second contact is laterally between the first electrode and the first contact.

In eighth examples, for any of the first through seventh examples, the integrated circuit capacitor structure further includes a liner layer between the ferroelectric layer and the first electrode, where the liner includes a second metal and has a thickness between 2 nm and 10 nm.

In ninth examples, an integrated circuit capacitor structure includes a first electrode including a first metal feature below a second electrode including a second metal feature. The integrated circuit capacitor structure further includes a third electrode having a columnar structure through the first electrode and the second electrode and a plurality of lateral extensions vertically spaced apart along a height of the columnar structure. The first electrode is adjacent to the columnar structure and under a first of the plurality of lateral extensions and where the second electrode is adjacent to the columnar structure above the first of the plurality of lateral extensions and below a second of the plurality of lateral extensions. The integrated circuit capacitor structure further includes a ferroelectric layer between the third electrode and each of the first and second electrodes.

In tenth examples, for any of the ninth examples, the first of the plurality of lateral extensions laterally extends a first distance over the first electrode and where the second of the plurality of lateral extensions laterally extends a second distance over the second electrode, where the first distance is equal to the second distance.

In eleventh examples, for any of the ninth through tenth examples, the first outer electrode extends laterally beyond the second outer electrode, where a first contact is coupled with the first outer electrode and a second contact is coupled with the second outer electrode and where the second contact is laterally between the first electrode and the first contact.

In twelfth examples, for any of the ninth through eleventh examples, the ferroelectric layer extends laterally from the columnar structure below the first of the plurality of lateral extensions to the first contact structure.

In thirteenth examples, for any of the ninth through twelfth examples, the ferroelectric layer extends laterally from the columnar structure above the first of the plurality of lateral extensions to an edge of the second electrode.

In a fourteenth example, for any of the ninth through thirteenth examples, the ferroelectric layer extends laterally from the columnar structure below the second of the plurality of lateral extensions.

In fifteenth examples, for any of the ninth through fourteenth examples, the third electrode further includes a third of a plurality of lateral extensions along the height of the columnar structure, where the third of a plurality of lateral extensions is between the first of the plurality of lateral extensions and the second of the plurality of lateral extensions, where the first electrode is adjacent to the columnar structure between the first of the plurality of lateral extensions and the third of the plurality of lateral extensions, and where the ferroelectric layer is further between the third of the plurality of lateral extensions and the first electrode.

In sixteenth examples, for any of the ninth through fifteenth examples, the third electrode further includes a fourth of a plurality of lateral extensions along the height of the columnar structure, where the fourth of a plurality of lateral extensions is above the second of the plurality of lateral extensions, where the second electrode is adjacent to the columnar structure between the second of the plurality of lateral extensions and the fourth of the plurality of lateral extensions, and where the ferroelectric layer is further between the fourth of the plurality of lateral extensions and the second electrode.

In seventeenth examples, for any of the ninth through sixteenth examples, the first electrode and the second electrodes are above the third of the plurality of lateral extensions and where the first electrode is vertically separated from the second electrode by at least 5 nm.

In eighteenth examples, for any of the ninth through seventeenth examples, the first electrode includes a first layer around the first of the plurality of lateral extensions, a second layer above the first layer, the second layer around the third of the plurality of lateral extensions, and a third layer between the first and the second layer and where the second electrode includes a first layer around the second of the plurality of lateral extensions, a second layer above the first layer, the second layer around the fourth of the plurality of lateral extensions, and a third layer between the first and the second layer.

In nineteenth examples, a system includes a processor and a radio transceiver coupled to the processor, where the transceiver includes a transistor. The transistor includes a drain contact coupled to a drain, a source contact coupled to a source and a gate contact coupled to a gate. The system further includes an integrated capacitor device structure coupled to a drain of the transistor. The integrated capacitor device includes a first electrode including a cylindrical column, where the cylindrical column is coupled to the drain contact, a ferroelectric layer around an exterior sidewall of the cylindrical column and a plurality of outer electrodes where a first outer electrode is laterally adjacent to a first portion of an exterior of the ferroelectric layer and a second outer electrode is laterally adjacent to a second portion of the exterior of the ferroelectric layer, where the second outer electrode is above the first outer electrode.

In twentieth example, for any of the nineteenth examples, the system further includes a battery and an antenna coupled with the processor.

What is claimed is:

1. An integrated circuit capacitor structure, comprising:
   a first electrode comprising a cylindrical column;
   a ferroelectric layer around an exterior sidewall of the cylindrical column; and
   a plurality of outer electrodes, comprising:
      a first outer electrode laterally adjacent to a first portion of an exterior of the ferroelectric layer; and
      a second outer electrode laterally adjacent to a second portion of the exterior of the ferroelectric layer, wherein the second outer electrode is above the first outer electrode, and wherein the first outer electrode extends laterally beyond an end of the second outer electrode;
   a first dielectric layer adjacent to the ferroelectric layer and vertically between the first outer electrode and the second outer electrode;
   a second dielectric layer over the second outer electrode;
   a first contact extending through the first dielectric layer, wherein the first contact is laterally beyond the end of the second outer electrode and is in contact with the first outer electrode; and
   a second contact extending through the second dielectric layer and in contact with the second outer electrode, wherein the second contact is laterally between the first electrode and the first contact.

2. The integrated circuit capacitor structure of claim 1, wherein the ferroelectric layer has a thickness between 2 nm and 50 nm, and wherein the ferroelectric layer comprises oxygen and one or more of Pb, Zr, Hf, Sr, Ba or Ti.

3. The integrated circuit capacitor structure of claim 1, wherein the second outer electrode is vertically spaced apart from the first outer electrode by a distance of at least 5 nm.

4. The integrated circuit capacitor structure of claim 3, wherein the second dielectric layer is adjacent to the end of the second outer electrode and over the first dielectric layer, and wherein the first contact also extends through the second dielectric layer.

5. The integrated circuit capacitor structure of claim 4, wherein the second dielectric layer is in contact with a portion of the first dielectric layer beyond the end of the second outer electrode.

6. The integrated circuit capacitor structure of claim 4, wherein the second dielectric layer extends over the first electrode.

7. The integrated circuit capacitor structure of claim 6, wherein a top surface of the first contact is coplanar with a top surface of the second contact, and coplanar with a top surface of the second dielectric layer.

8. The integrated circuit capacitor structure of claim 7, further comprising a third dielectric layer under the ferroelectric layer and under the first outer electrode.

9. The integrated circuit capacitor structure of claim 8, further comprising a conductive interconnect, under, and in contact with a bottom of the first electrode.

10. The integrated circuit capacitor structure of claim 9, wherein:
    the capacitor structure further comprises a liner layer between the ferroelectric layer and the first electrode;
    the first electrode comprises a first metal;
    the liner layer comprises a second metal;
    the first electrode is in contact with the conductive interconnect; and
    the liner layer is spaced apart from the third dielectric layer by the ferroelectric layer.

11. The integrated circuit capacitor structure of claim 1, wherein the ferroelectric layer around an exterior sidewall of the cylindrical column comprises a first vertical thickness, wherein a combined vertical thickness of first outer electrode and the second outer electrode comprises a second vertical thickness, and wherein the second vertical thickness is between 90% and 95% of the first vertical thickness.

12. The integrated circuit capacitor structure of claim 1, wherein the first dielectric layer extends laterally beyond the end of the second outer electrode.

13. The integrated circuit capacitor structure of claim 1, wherein a top surface of the first contact is coplanar with a top surface of the second contact.

14. The integrated circuit capacitor structure of claim 1, further comprising a liner layer between the ferroelectric layer and the first electrode, wherein the first electrode comprises a first metal and the liner layer comprises a second metal, and wherein the liner layer has a thickness between 2 nm and 10 nm.

15. The integrated circuit capacitor structure of claim 14, wherein the first metal comprises titanium, tantalum, tungsten, or ruthenium.

16. The integrated circuit capacitor structure of claim 15, wherein the second metal comprises ruthenium, tungsten, titanium, or tantalum.

* * * * *